United States Patent
Daryanani

(10) Patent No.: US 12,313,476 B2
(45) Date of Patent: May 27, 2025

(54) TEMPERATURE SENSOR INTEGRATED IN A TRANSISTOR ARRAY

(71) Applicant: Microchip Technology Incorporated, Chandler, AZ (US)

(72) Inventor: Sonu Daryanani, Tempe, AZ (US)

(73) Assignee: Microchip Technology Incorporated, Chandler, AZ (US)

( * ) Notice: Subject to any disclaimer, the term of this patent is extended or adjusted under 35 U.S.C. 154(b) by 665 days.

(21) Appl. No.: 17/692,381

(22) Filed: Mar. 11, 2022

(65) Prior Publication Data
US 2023/0015578 A1    Jan. 19, 2023

Related U.S. Application Data

(60) Provisional application No. 63/217,352, filed on Jul. 1, 2021.

(51) Int. Cl.
| | |
|---|---|
| *G01K 7/16* | (2006.01) |
| *G01K 7/01* | (2006.01) |
| *H10D 86/00* | (2025.01) |
| *H10D 86/80* | (2025.01) |

(52) U.S. Cl.
CPC .............. *G01K 7/16* (2013.01); *G01K 7/01* (2013.01); *H10D 86/00* (2025.01); *H10D 86/80* (2025.01); *G01K 2217/00* (2013.01)

(58) Field of Classification Search
CPC ........ G01K 7/16; G01K 7/01; G01K 2217/00; H01L 27/0248; H01L 29/1608; H01L 29/7803; H01L 29/7838; H10D 86/00; H10D 86/80; H10D 84/141

USPC .......................................................... 257/470
See application file for complete search history.

(56) References Cited

U.S. PATENT DOCUMENTS

| | | | | |
|---|---|---|---|---|
| 4,760,434 | A * | 7/1988 | Tsuzuki | H01L 23/34 257/470 |
| 5,304,837 | A * | 4/1994 | Hierold | H01L 27/0248 257/341 |
| 5,821,599 | A | 10/1998 | Rupp | 257/467 |
| 2004/0090726 | A1* | 5/2004 | Ball | H02H 9/001 361/93.9 |
| 2007/0176212 | A1* | 8/2007 | Zundel | G01K 7/186 374/E7.023 |

(Continued)

OTHER PUBLICATIONS

International Search Report and Written Opinion, Application No. PCT/US2022/035071, 13 pages, Oct. 14, 2022.

*Primary Examiner* — Igwe U Anya
(74) *Attorney, Agent, or Firm* — SLAYDEN GRUBERT BEARD PLLC

(57) ABSTRACT

A temperature sensor integrated in a transistor array, e.g., metal-oxide-semiconductor field-effect transistor (MOSFET) array, is provided. The integrated temperature sensor may include a doped well region formed in a substrate (e.g., SiC substrate), a resistor gate formed over the doped well region, first and second sensor terminals conductively coupled to the doped well region on opposite sides of the resistor gate. The integrated temperature sensor includes a gate driver to apply a voltage to the resistor gate that affects a resistance of the doped well region below the resistor gate, and temperature analysis circuitry to determine a resistance of a conductive path passing through the doped well region, and determine a temperature associated with the transistor array.

21 Claims, 13 Drawing Sheets

(56) References Cited

U.S. PATENT DOCUMENTS

2007/0205464 A1    9/2007  Sander et al. ................ 257/350
2020/0049569 A1*   2/2020  Arens ..................... H01L 23/34

* cited by examiner

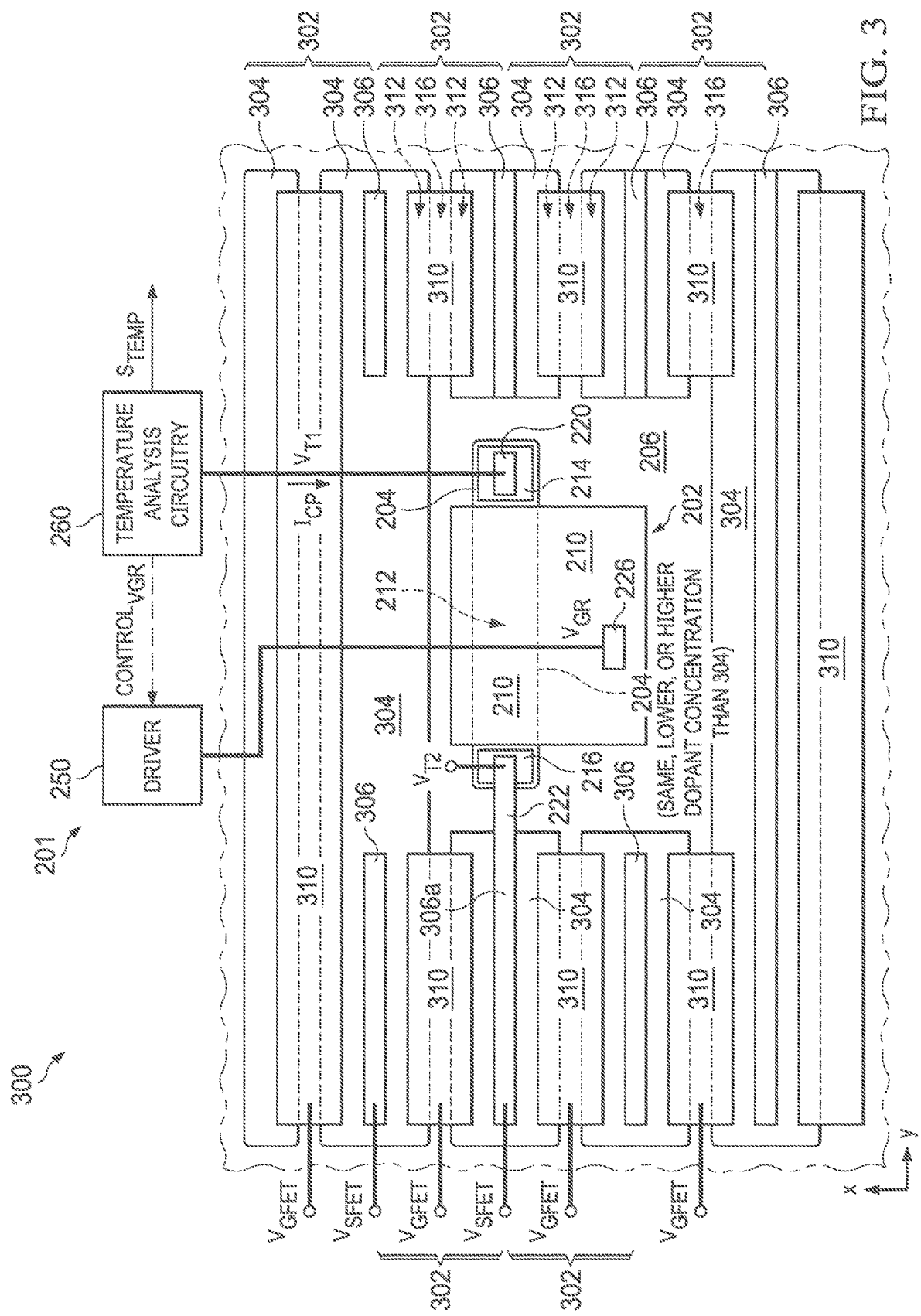

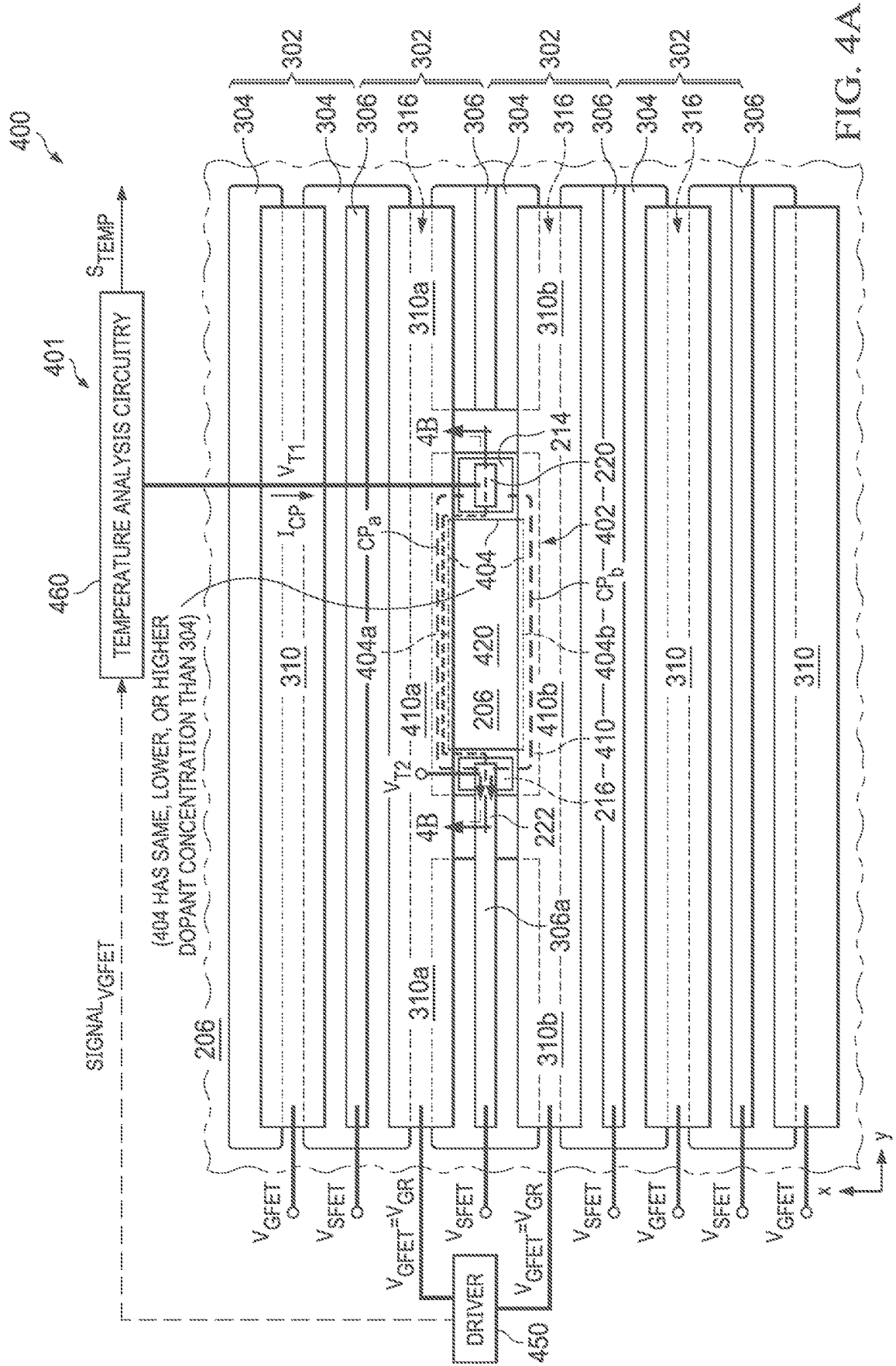

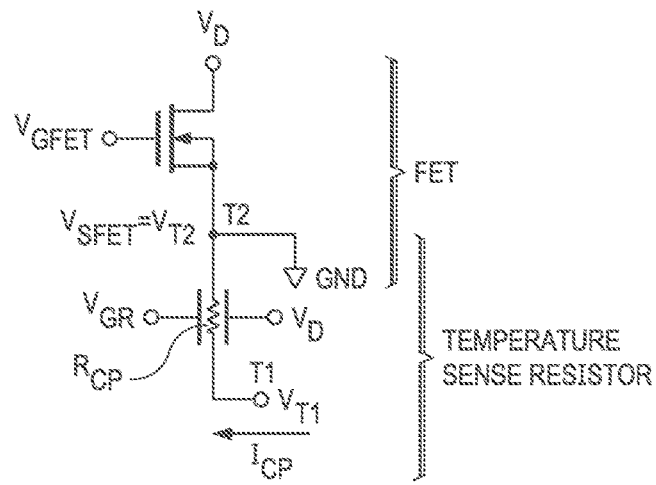

$V_D$ = FET DRAIN VOLTAGE
$V_{GFET}$ = FET GATE VOLTAGE
$V_{SFET}$ = FET SOURCE VOLTAGE, TIED TO RESISTOR TERMINAL T2 ($V_{SFET} = V_{T2}$)
$V_{GR}$ = RESISTOR GATE VOLTAGE, INDEPENDENT FROM $V_{GFET}$
$I_{CP}$ = RESISTOR FORCE CURRENT APPLIED AT TERMINAL T1 (OPTIONAL)
$V_{T1}$ = RESISTOR SENSE VOLTAGE AT RESISTOR TERMINAL T1 (OPTIONAL)
$R_{CP}$ = RESISTANCE OF THE TEMPERATURE SENSE RESISTOR

FIG. 5A

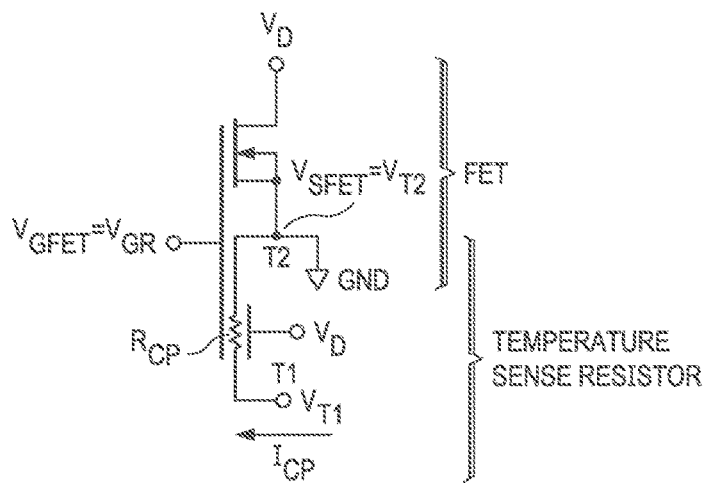

$V_D$ = FET DRAIN VOLTAGE
$V_{GFET}$ = $V_{GR}$ = FET GATE VOLTAGE / RESISTOR GATE VOLTAGE
$V_{SFET}$ = FET SOURCE VOLTAGE, TIED TO RESISTOR TERMINAL T2 ($V_{SFET} = V_{T2}$)
$I_{CP}$ = RESISTOR FORCE CURRENT APPLIED AT TERMINAL T1 (OPTIONAL)
$V_{T1}$ = RESISTOR SENSE VOLTAGE AT RESISTOR TERMINAL T1 (OPTIONAL)
$R_{CP}$ = RESISTANCE OF THE TEMPERATURE SENSE RESISTOR

FIG. 5B

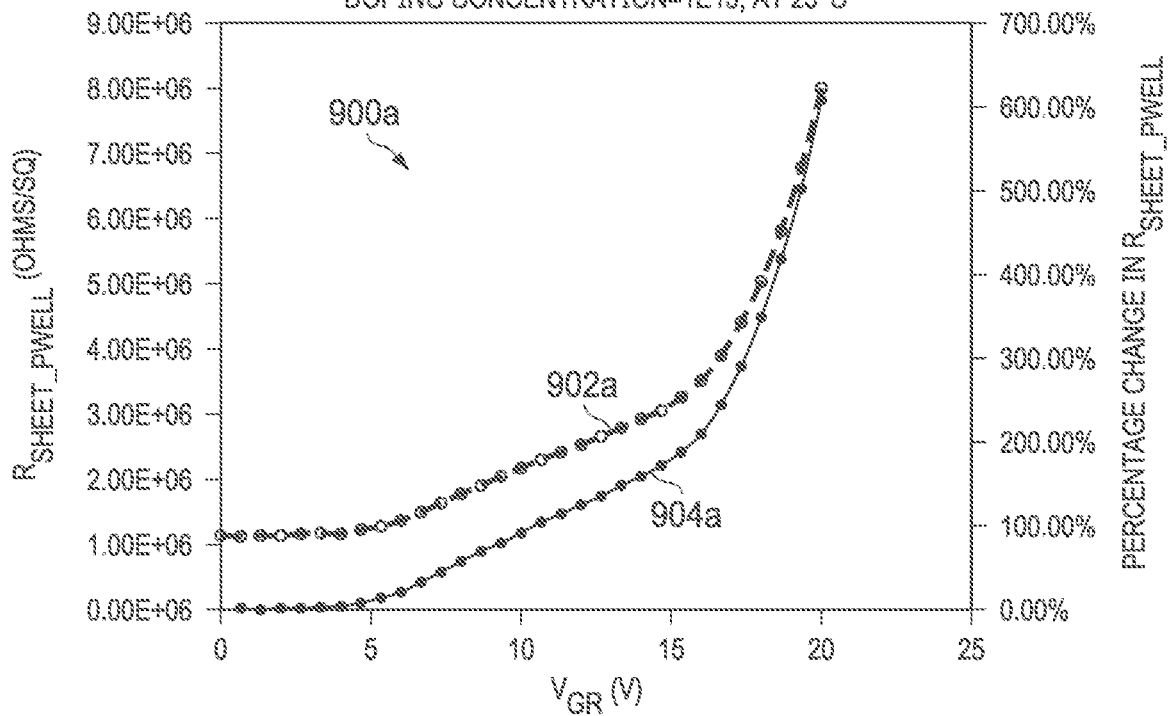
FIG. 9A $R_{SHEET\_P-WELL}$ VS. $V_{GR}$ FOR P-WELL DOPING CONCENTRATION=1E13, AT 25°C
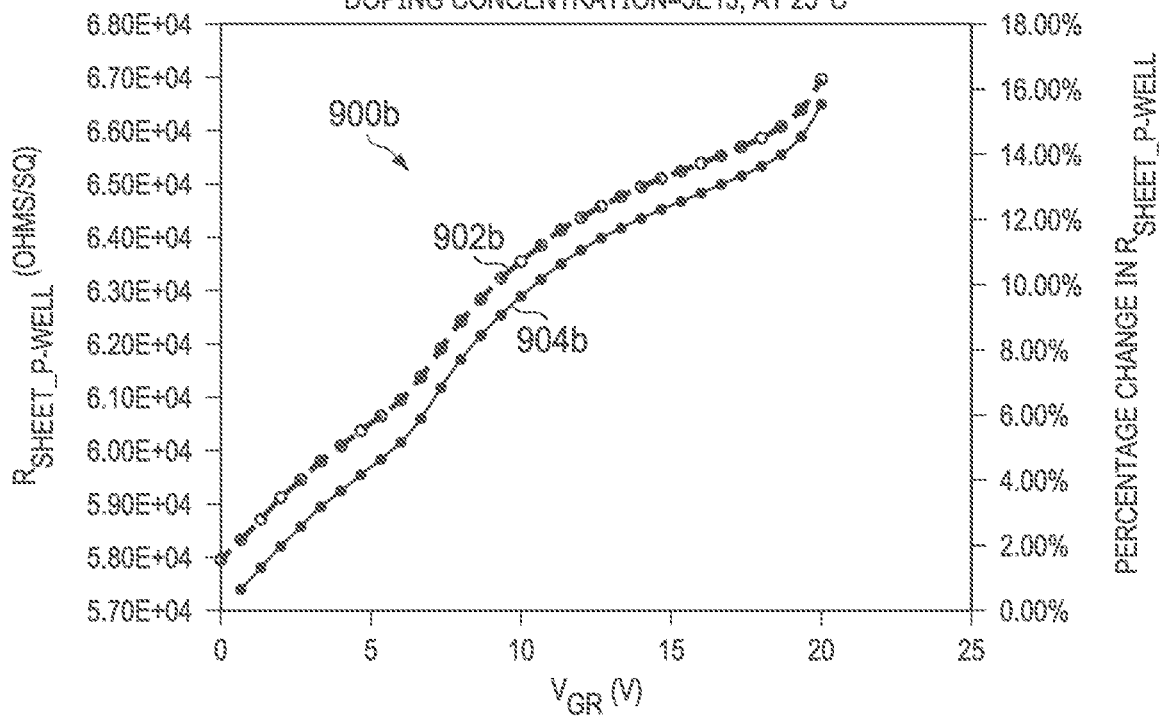
FIG. 9B $R_{SHEET\_P-WELL}$ VS. $V_{GR}$ FOR P-WELL DOPING CONCENTRATION=5E13, AT 25°C

TEMPERATURE SENSOR INTEGRATED IN A TRANSISTOR ARRAY

RELATED APPLICATION

This application claims priority to commonly owned U.S. Provisional Patent Application No. 63/217,352 filed Jul. 1, 2021, the entire contents of which are hereby incorporated by reference for all purposes.

TECHNICAL FIELD

The present disclosure relates to temperature sensors, and more particularly to a temperature sensor integrated in a transistor array (e.g., a metal-oxide-semiconductor field-effect transistor (MOSFET) array) and a method for using such integrated temperature sensor.

BACKGROUND

Many integrated circuit (IC) chips include MOSFET arrays. A MOSFET is a metal-oxide-semiconductor field-effect transistor, which is an insulated-gate field-effect transistor in which the voltage of the gate controls the operation of the device. FIGS. 1A and 1B show a top view and a cross-sectional side view, respectively, of an example power MOSFET 100 built on silicon carbide (SiC) and thus referred to as a SiC MOSFET. Power MOSFET 100 includes a pair of n+ source regions 102a and 102b (e.g., nitrogen doped implants) formed in a respective pair of p-wells 104a and 104b (e.g., aluminum implants) formed in an n-type SiC epitaxial layer 110. A p-well tie 112a, 112b may be formed in each respective p-well 104a, 104b to provide a conductive contact for a respective pair of source contacts or terminals 114a, 114b (e.g., aluminum wires). P-well ties 112a and 112b may comprise higher concentration p-doped regions within p-wells 104a and 104b, respectively.

A gate oxide 120 is formed over the source regions 102a and 102b, and a gate 122 (e.g., formed from n-doped polysilicon, or metal) is formed over the gate oxide 120. An n+ drain 130 (e.g., comprising sintered gold or sintered nickel silicide) is formed on the backside of the SiC epitaxial layer 110. In operation, in an ON state of the power MOSFET 100 an electron flow EF is generated from source regions 102a, 102b through a junction-gate field-effect transistor (JFET) channel 140 between p-wells 104 and 108 and down to the backside drain 130.

The temperature of a MOSFET varies as a function of the MOSFET operation and related components. For example, a MOSFET may experience a range of temperature variations during operation. In addition, the MOSFET temperature may increase beyond the normal operational range as a result of a device failure or other detrimental condition, for example device degradation, a malfunction of the gate driver chip that drives the MOSFET gate, or an electrical short or other malfunction associated with the MOSFET load. These conditions may be particularly significant in certain types of MOSFETs, for example power MOSFETs designed to handle significant power or voltages levels (e.g., voltages above 500V for applications such as electric vehicles or green energy systems, without limitation), due to the high potential power dissipation in such devices.

Thus, the condition of a MOSFET can be checked by monitoring the MOSFET temperature over time. Conventional temperature sensing of MOSFETs has typically been performed off the chip using external circuitry. Integrated temperature sensors, i.e., temperature sensors formed integrated with a MOSFET array, have been developed more recently. However, such integrated temperature sensors typically have low sensitivity, and may be unusable in certain switching states of the MOSFET array and also have process and integration limitations.

SUMMARY

The present disclosure provides a temperature sensor integrated in a field-effect transistor (FET) array, e.g., a power MOSFET array. The integrated temperature sensor may include a resistor including a doped well region (e.g., a p-well region) and circuitry for measuring a resistance of the doped well region and calculating a temperature associated with the transistor array based on the measured resistance. Thus, the resistor may be referred to herein as a temperature sense resistor. The resistance of the doped well region may be adjusted by applying a selected voltage to a control gate formed over the doped well region (and separated from the doped well region by a gate oxide), for example to increase the sensitivity of the temperature sensor or to reduce the dependence of the measured resistance (and thus the calculated temperature) on the ON/OFF state of the FET array.

In some examples, a terminal of the temperature sense resistor may be electrically tied to the source contact for at least one FET in the array.

In some examples, the control gate of the resistor is electrically tied to a control gate of at least one FET in the array. In other examples, the control gate of the resistor has an independent terminal distinct from the control gates of the FETs in the array.

The integrated temperature sensor may be used to monitor a temperature associated with one or more FET, e.g., to detect an abnormal temperature that may indicate a problem with the monitored FET(s) or related components. For example, an integrated temperature sensor may be used to monitor one or more high power MOSFET, e.g., MOSFET(s) using voltages above 500V, for example in applications related to electric vehicles or green energy systems, without limitation. In some examples, multiple instances of the temperature sense resistor are integrated across an FET array or other area of an integrated circuit die and connected in parallel, such that an average temperature of the FET array or relevant die area may be calculated.

One aspect provides a temperature sensor integrated in a transistor array. The integrated temperature sensor includes a resistor comprising a doped well region formed in a substrate (e.g., SiC substrate), a resistor gate formed over the doped well region and separated from the doped well region by a gate oxide, and a first sensor terminal and a second sensor terminal conductively coupled to the doped well region on opposite sides of the resistor gate. The integrated temperature sensor also includes a gate driver to apply a voltage to the resistor gate that affects a resistance of the doped well region below the resistor gate. The integrated temperature sensor also includes temperature analysis circuitry to determine a resistance-related value corresponding with a resistance of a conductive path passing through the doped well region, analyze a temperature associated with the transistor array based at least on the determined resistance-related value corresponding with the resistance of the conductive path passing through the doped well region, and output a temperature-related signal based on the analyzed temperature.

In some examples, the doped well region comprises a p-well region.

In some examples, the resistor gate is conductively coupled to a control gate for at least one transistor cell in the transistor array In some examples, the second sensor terminal is conductively coupled to a transistor source terminal for at least one transistor cell in the transistor array.

Another aspect provides a transistor array including a plurality of transistors including a plurality of transistor doped well regions formed in a substrate, and a temperature sensor. The temperature sensor includes a resistor comprising a sensor doped well region formed in the substrate, a resistor gate formed over the second doped well region and separated from the doped well region by a gate oxide, and first and second sensor terminals conductively coupled to the second doped well region on opposite sides of the resistor gate. The temperature sensor also includes a gate driver to apply a voltage to the resistor gate that affects a resistance of the second doped well region, and temperature analysis circuitry to determine a resistance-related value corresponding with a resistance of a conductive path passing through the doped well region, analyze a temperature associated with the transistor array based at least on the determined resistance-related value corresponding with the resistance of the conductive path passing through the doped well region, and output a temperature-related signal based on the analyzed temperature.

In some examples, the plurality of transistors comprises a plurality of metal-oxide-semiconductor field-effect transistors.

In some examples, the plurality of transistors includes a plurality of transistor gates, and wherein the resistor gate and the plurality of transistor gates are formed in a common gate layer. In some examples, the common gate layer comprises a common metal layer.

In some examples, the second sensor terminal is electrically connected to a transistor source contact for at least one transistor of the plurality of transistors.

In some examples, the second sensor terminal and the transistor source contact are defined by a common electrically conductive structure.

In some examples, the resistor gate is connected to a transistor gate of at least one transistor of the plurality of transistors.

In some examples, the resistor gate and the transistor gate are defined by a common electrically conductive structure.

In some examples, the second doped well region of the temperature sensor has a different dopant concentration than the first doped well regions of the plurality of transistors.

In some examples, the second doped well region of the temperature sensor has a lower dopant concentration than the first doped well regions of the plurality of transistors.

Another aspect provides a method for determining a temperature associated with transistor array using a temperature sensor integrated in the transistor array and including (a) a doped well region formed in a substrate, and (b) a resistor gate formed over the sensor doped well region and separated from the doped well region by a gate oxide, resistor gate. The method includes applying a voltage to the resistor gate that affects a resistance of the doped well region, generating a current along a conductive path passing through the doped well region, determining a resistance-related value corresponding with a resistance of the conductive path passing through the doped well region, analyzing a temperature associated with the transistor array based at least on the determined resistance-related value corresponding with the resistance of the conductive path passing through the doped well region, and outputting a temperature-related signal based on the analyzed temperature.

In some examples, the voltage applied to the resistor gate increases the resistance of the doped well region.

In some examples, the resistance of the doped well region is determined by temperature analysis circuitry connected to the first sensor terminal.

In some examples, the resistor gate is connected to a transistor control gate of at least one transistor of the plurality of transistors, and the voltage applied to the resistor gate is defined by a control gate voltage applied to the transistor control gate.

In some examples, the determining the conductive path passing through the doped well region includes supplying a current to the first sensor terminal, determining a voltage drop between the first sensor terminal and the second sensor terminal, and determining the resistance of the conductive path based on the supplied current and the measured voltage drop.

In some examples, the second sensor terminal is connected to a transistor source contact for at least one transistor of the plurality of transistors, a transistor source voltage is applied to the second sensor terminal, and determining a voltage drop between the first sensor terminal and the second sensor terminal comprises measuring a second terminal voltage at the first second sensor terminal and determining a difference between the second terminal voltage and the transistor source voltage.

In some examples, determining the conductive path passing through the doped well region includes applying a first terminal voltage to the first sensor terminal, measuring a current through the conductive path, and determining the resistance of the conductive path based on the first terminal voltage and the measured current.

BRIEF DESCRIPTION OF THE DRAWINGS

Example aspects of the present disclosure are described below in conjunction with the figures, in which:

FIG. 3 illustrates an example FET array including the example integrated temperature sensor including the temperature sense resistor shown in FIGS. 2A-2C, wherein the temperature sense resistor includes a control gate independently controllable from FET gates in the array;

FIG. 4A illustrates another example FET array including an example integrated temperature sensor including an example temperature sense resistor that shares a pair of control gates with adjacent FET cells;

FIG. 5A illustrates a circuit diagram for a portion of an example FET array including a temperature sense resistor and a nearby FET, wherein the temperature sense resistor control gate is independently controllable from FET gates in the array, e.g., according to the example FET array shown in FIG. 3;

FIG. 5B provides a circuit diagram for a portion of an example FET array including a temperature sense resistor and a nearby FET, wherein the temperature sense resistor control gate is tied to one or more FET gates in the array, e.g., according to the example FET array shown in FIG. 4A;

FIGS. 9A and 9B show graphs illustrating example relationships between p-well sheet resistance and resistor gate voltage applied to a temperature sense resistor, for an example temperature sense resistor with a p-well region having a lower dopant concentration (FIG. 9A) and an example temperature sense resistor with a p-well region having a higher dopant concentration (FIG. 9B)

It should be understood the reference number for any illustrated element that appears in multiple different figures has the same meaning across the multiple figures, and the mention or discussion herein of any illustrated element in the context of any particular figure also applies to each other figure, if any, in which that same illustrated element is shown.

DETAILED DESCRIPTION

The present disclosure provides a temperature sensor integrated in a field-effect transistor (FET) array, e.g., a power MOSFET array. The integrated temperature sensor may include a temperature sense resistor including a doped well region (e.g., a p-well region) and circuitry for measuring a resistance of the doped well region and calculating a temperature associated with the transistor array based on the measured resistance. The resistance of the doped well region may be adjusted by applying a selected voltage to a control gate formed over the doped well region, for example to increase the sensitivity of the temperature sensor or to reduce the dependence of the measured resistance (and thus the calculated temperature) on the ON/OFF state of the FET array.

Figure 1A:
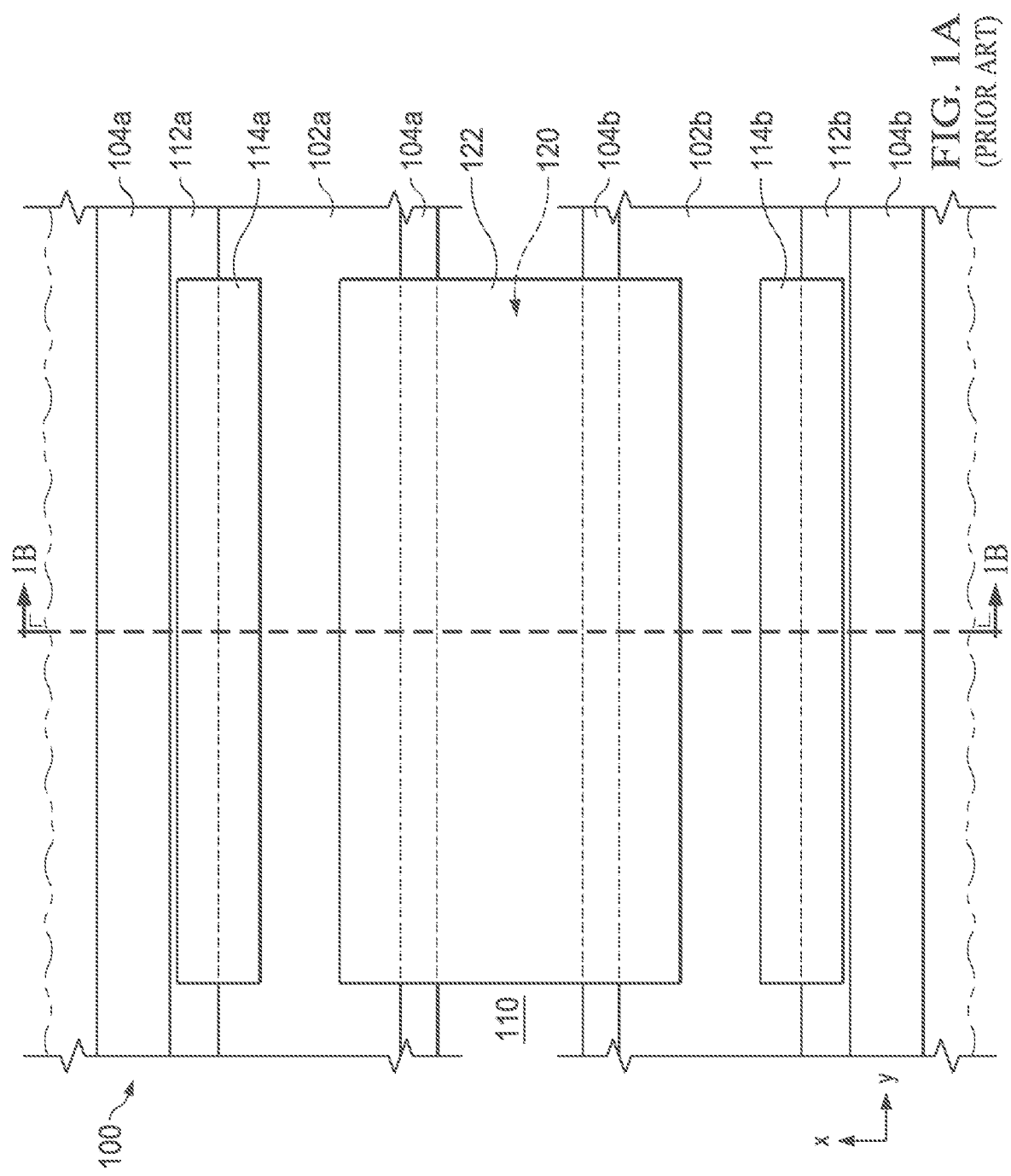
FIGS. 1A and 1B illustrate an example SiC power MOSFET.
Figure 1B:
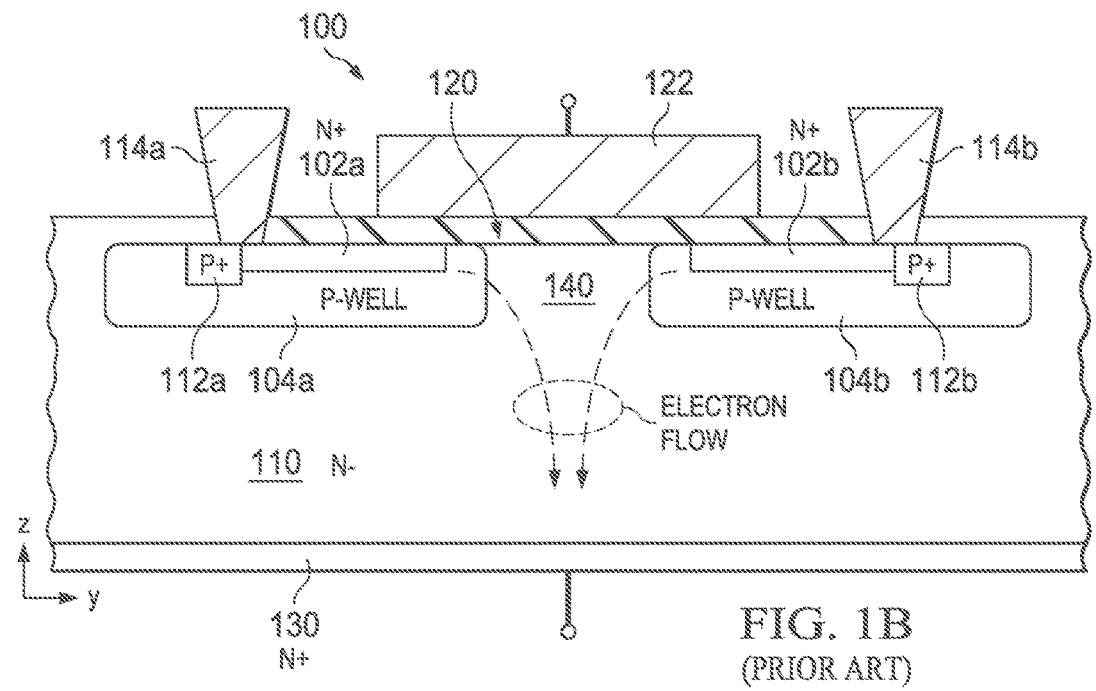
Figure 2A:
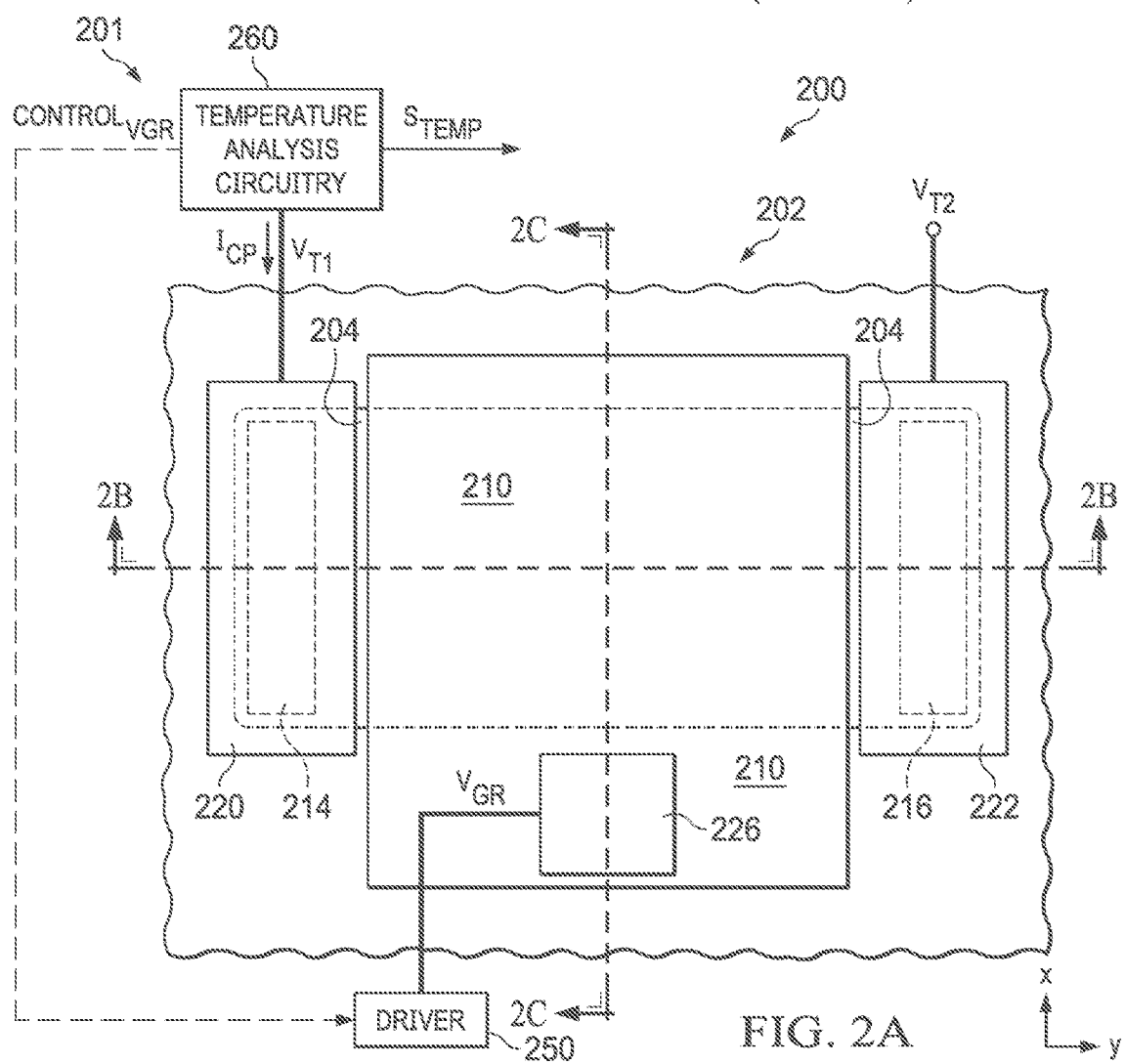
FIGS. 2A-2C illustrate an example integrated temperature sensor including an example temperature sense resistor having a controllable gate.
Figure 2B:
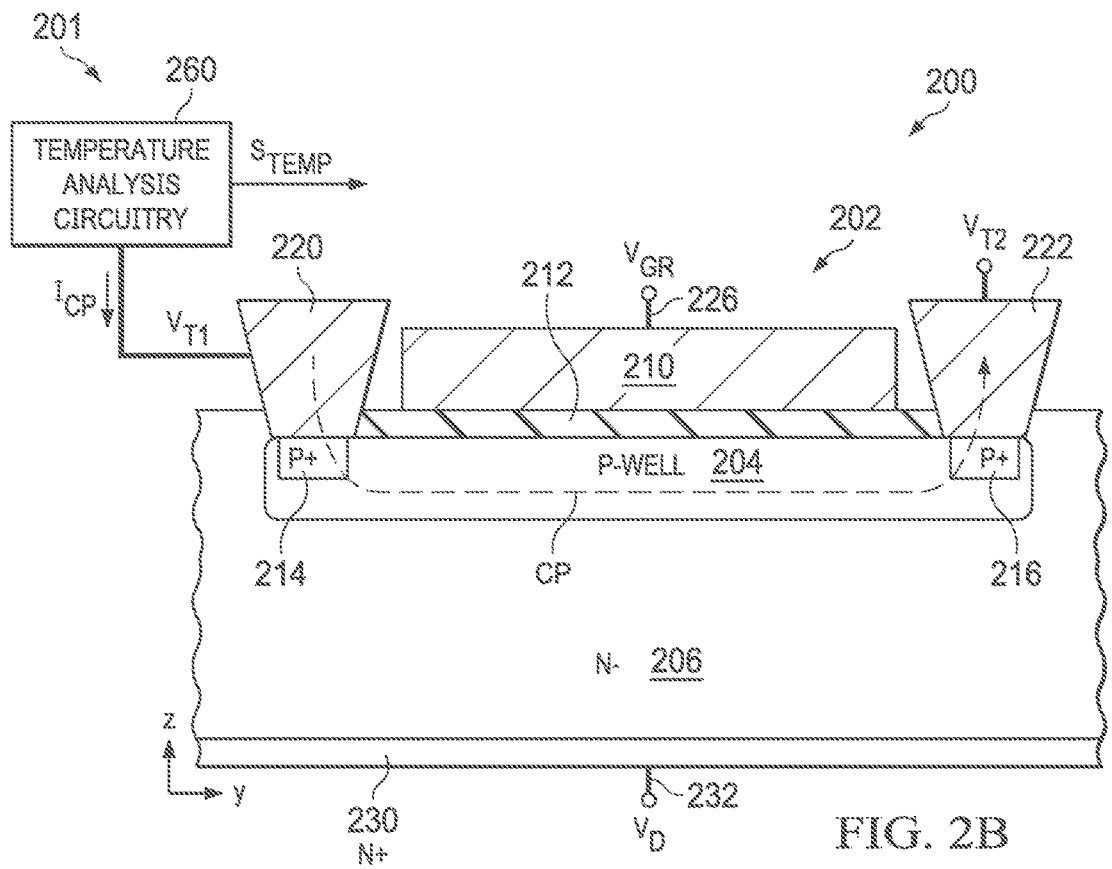
Figure 2C:
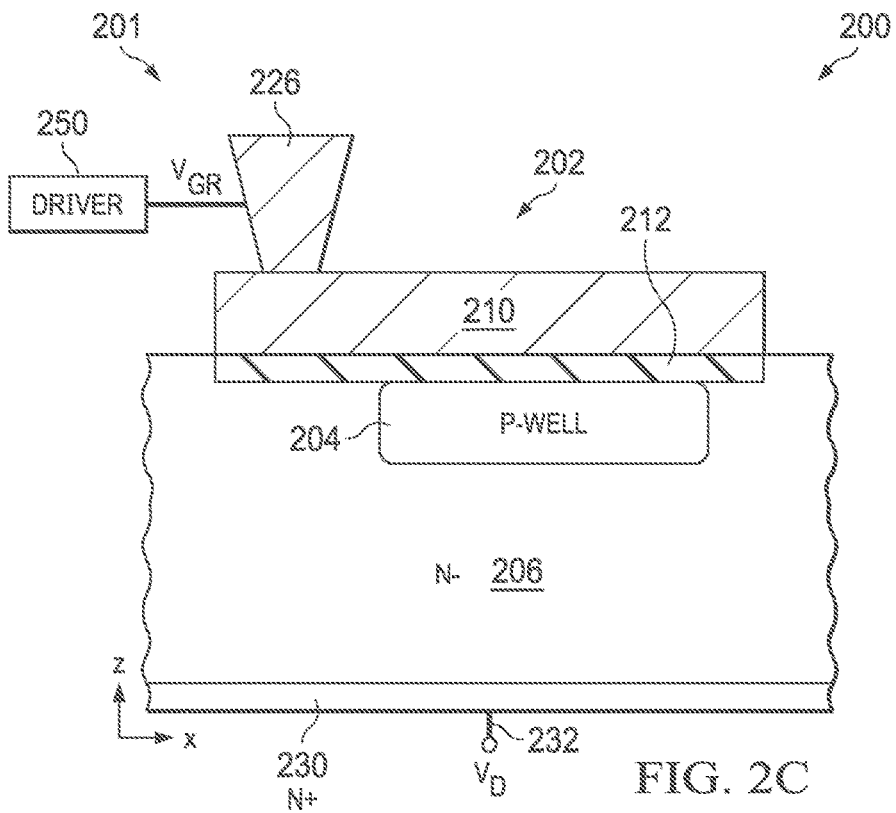

FIGS. 2A-2C illustrate an example integrated circuit structure 200 including an integrated temperature sensor 201. In particular, FIG. 2A shows a top view of integrated temperature sensor 201, FIG. 2B shows a first cross-sectional side view of integrated temperature sensor 201 taken along line 2B-2B shown in FIG. 2A, and FIG. 2C shows a second cross-sectional side view of integrated temperature sensor 201 taken along line 2C-2C shown in FIG. 2A. As discussed below, e.g., with reference to FIG. 3, integrated temperature sensor 201 may formed integral with a transistor array, e.g., a power MOSFET array or other FET array, and analyzes a temperature associated with the transistor array. Integrated temperature sensor 201 is also referred to as temperature sensor 201, for convenience.

As shown in FIGS. 2A-2C, the example temperature sensor 201 includes a controllable temperature sense resistor 202, a gate resistor gate driver 250, and a temperature analysis circuitry 260. FIGS. 2A-2C illustrate the physical structure of the temperature sense resistor 202. In contrast, the gate resistor gate driver 250 and temperature analysis circuitry 260 are illustrated schematically; gate resistor gate driver 250 and temperature analysis circuitry 260 may each be embodied by any suitable physical structures.

As shown in FIGS. 2A-2C, the temperature sense resistor 202 includes a sensor doped well region 204 (or doped well region 204, for convenience) formed in a substrate 206, and a resistor gate 210 formed over the doped well region 204 and separated from the doped well region 204 by a resistor gate oxide 212. The doped well region 204 may also be referred to as the resistor body. A first doped well tie 214 and a second doped well tie 216 are formed in the doped well region 204 on opposite sides (laterally) of the resistor gate 210. A first sensor terminal 220 and a second a second sensor terminal 222 are formed in contact with the doped well region 204. In particular, the first sensor terminal 220 is formed in contact with the first doped well tie 214, which provides a conductive contact between the first sensor terminal 220 and the doped well region 204, and the second sensor terminal 222 is formed in contact with the second doped well tie 216, which provides a conductive contact between the second sensor terminal 222 and the doped well region 204. A resistor gate terminal 226 (illustrated schematically, except in FIG. 2C) is formed in contact with the resistor gate 210.

In one example, the substrate 206 comprises an n-type SiC epitaxial region, and the doped well region 204 comprises a doped p-well region (e.g., defined by an aluminum implant) formed in the n-type SiC epitaxial substrate 206. The first and second doped well ties 214, 216 may comprise highly doped p+ regions (e.g., having a higher dopant concentration than the p-well region 204). The first sensor terminal 220, second sensor terminal 222, and resistor gate terminal 226 may each be formed from aluminum or other metal. The resistor gate 210 may be formed from n-doped polysilicon, or alternatively formed from metal (e.g., aluminum), and the resistor gate oxide 212 may comprise $SiO_2$ including a nitrogen dopant.

The integrated circuit structure 200 may also include an n+ drain region 230, e.g., comprising sintered gold or sintered nickel silicide, formed on the backside of the substrate 206. In some examples the integrated temperature sensor 201 is operated without triggering a vertical current flow through the substrate 206 from the temperature sense resistor 202 to the drain region 230, for example by selecting sufficiently low operating voltages to avoid triggering such vertical current flow.

In some examples (e.g., as shown in FIGS. 3 and 4), the second sensor terminal 222 is electrically tied to a variable-voltage FET source contact of at least one nearby FET, whereas in other examples the second sensor terminal 222 is tied to ground.

Further, in some examples (e.g., as shown in FIGS. 2A, 2C, and FIG. 3), the resistor gate terminal 226 is independently controllable from each FET gate in the relevant FET array, whereas in other examples (e.g., as shown in FIG. 4, discussed below) the resistor gate terminal 226 is electrically tied to at least one FET gate in the relevant FET array.

As shown in FIGS. 2A and 2C (and FIG. 3 discussed below), a resistor gate driver 250 is connected to the resistor gate terminal 226 to apply a resistor gate voltage $V_{GR}$ to the resistor gate 210 via the resistor gate terminal 226, which affects the resistance of the underlying doped well region 204. Resistor gate driver 250 controls resistor gate voltage $V_{GR}$ independently from FET gate voltages $V_{GFET}$ applied to FET gates in the relevant FET array. (In other examples, e.g., the example shown in FIG. 4, the resistor gate voltage $V_{GR}$ is tied to the FET gate voltage $V_{GFET}$ applied to adjacent FET gates in the FET array).

In some examples, e.g., as shown in FIG. 2A (and FIG. 3 discussed below), temperature analysis circuitry 260 may include circuitry to select the resistor gate voltage $V_{GR}$ and control resistor gate driver 250 by sending a control signal $Control_{VGR}$ specifying $V_{GR}$ to be applied to the resistor gate terminal 226 by resistor gate driver 250.

Temperature analysis circuitry 260 may also include circuitry to:

(a) determine at least one resistance-related value corresponding with the conductive path CP (see FIG. 2B) passing through the doped well region 204;

(b) analyze a temperature associated with the temperature sense resistor 202 (e.g., corresponding with a temperature of a transistor array or area of a transistor array in which the temperature sense resistor 202 is integrated) based at least on the determined resistance-related value(s) corresponding with the resistance of the conductive path CP passing through the doped well region 204; and (c) output a temperature-related signal $S_{temp}$ based on the analyzed temperature.

As used herein, a resistance-related value corresponding with the conductive path CP (passing through the doped well region 204) may refer to (a) a value representing a resistance of the conductive path CP ($R_{CP}$) or (b) a value of a parameter that varies as a function of $R_{CP}$, for example a voltage (in volts) associated with the conductive path CP (e.g., a difference between a voltage $V_{T1}$ at the first sensor terminal 220 and a voltage $V_{T2}$ at the second sensor terminal 222, i.e. a voltage drop between first sensor terminal 220 and second sensor terminal 222), or a current (amperes) associated with the conductive path CP). The resistance of the conductive path CP ($R_{CP}$) includes (b) a resistance of the doped well region 204 itself ($R_{p-well}$), and (b) a respective contact resistance ($R_{contact}$) between the doped well region 204 and each of the first sensor terminal 220 and second sensor terminal 222, wherein the resistance components are arranged in series (i.e., additive). In some examples, the doped well region resistance ($R_{p-well}$) may be much larger (e.g., by orders of magnitude) than the contact resistances ($R_{contact}$), such that the contact resistances constitute a negligible component of the conductive path resistance $R_{CP}$.

Resistance-related values corresponding with the conductive path CP may be measured or determined in any suitable manner using temperature analysis circuitry 260. For example, temperature analysis circuitry 260 may include circuitry to determine any of the following example resistance-related values using any of the following processes:

Example (1): resistance-related value=voltage $V_{T1}$ at the first sensor terminal 220. An example process for determining the voltage at first sensor terminal 220 includes (a) passing a predetermined current $I_{CP}$ (e.g., 100 microamps) along the conductive path CP, e.g., by supplying the current to the first sensor terminal 220, and (b) measuring the voltage $V_{T1}$ at first sensor terminal 220. Voltage $V_{T1}$ may correspond with the resistance of the conductive path CP in a situation in which the voltage at second sensor terminal 222 is known, e.g., where second sensor terminal 222 is grounded or otherwise held constant.

Example (2): resistance-related value=voltage drop $V_{T1}$-$V_{T2}$ between the first sensor terminal 220 and second sensor terminal 222. An example process for determining the voltage drop $V_{T1}$-$V_{T2}$ includes (a) passing a predetermined current $I_{CP}$ (e.g., 100 microamps) along the conductive path CP, e.g., by supplying the current to the first sensor terminal 220, (b) measuring the voltage $V_{T1}$ at first sensor terminal 220 and voltage $V_{T2}$ at second sensor terminal 222, and (c) calculating the voltage drop $V_{T1}$-$V_{T2}$.

Example (3): resistance-related value=current $I_{CP}$ through conductive path CP. An example process for determining the current $I_{CP}$ in a situation in which the voltage at second sensor terminal 222 is known (e.g., where second sensor terminal 222 is grounded or otherwise constant and known) includes (a) apply a predetermined voltage $V_{T1}$ at the first sensor terminal 220, and (b) measure the current $I_{CP}$ at the first sensor terminal 220. An example process for determining the current $I_{CP}$ in a situation in which the voltage at second sensor terminal 222 is variable or unknown (e.g., where second sensor terminal 222 is tied to a variable-voltage FET source contact) includes (a) apply a predetermined voltage $V_{T1}$ at the first sensor terminal 220, (b) measure the voltage $V_{T2}$ at second sensor terminal 222, and (c) measuring the current $I_{CP}$ at the first sensor terminal 220. In either case, the amount of current $I_{CP}$ may correspond with the resistance of the conductive path CP. In some examples, temperature analysis circuitry 260 selects a value of $V_{T1}$ (signaled to resistor gate driver 250 via control signal $Control_{VGR}$) that is sufficiently low so as to not trigger a vertical current flow through the p-n diode defined by integrated circuit structure 200. For example, in an example IC structure 200 built on SiC substrate 206 where the p-n diode is activated (turns on) by voltage above 2V, temperature analysis circuitry 260 may select a $V_{T1}$ of ≤1V.

Example (4): resistance-related value=resistance $R_{CP}$, i.e., the resistance across the conductive path CP. A first example process for determining resistance $R_{CP}$ includes (a) determine the voltage $V_{T1}$ according to the process described above for Example (1); and (b) calculate resistance $R_{CP}$ based on the voltage $V_{T1}$ and current $I_{CP}$. A second example process for determining resistance $R_{CP}$ includes (a) determine the voltage drop $V_{T1}$-$V_{T2}$ according to the process described above for Example (2); and (b) calculate resistance $R_{CP}$ based on the voltage drop $V_{T1}$-$V_{T2}$ and current $I_{CP}$. A third example process for determining resistance $R_{CP}$ includes (a) determine the current $I_{CP}$ according to the process described above for Example (3); and (b) calculate resistance $R_{CP}$ based on the current $I_{CP}$ and the voltage $V_{T1}$ (where $V_{T2}$ is constant and known) or voltage drop $V_{T1}$-$V_{T2}$ (where $V_{T2}$ is variable or unknown).

As noted above, the resistance $R_{CP}$ is dependent on the temperature of the resistor 202, in particular the temperature of the doped well region 204 through which the conductive path CP passes. Thus, each resistance-related value discussed above is also temperature dependent. In some examples, temperature analysis circuitry 260 includes circuitry to analyze a resistor temperature associated with the resistor 202 based on one or more of such temperature-dependent resistance-related value(s), e.g., any one or more of the example resistance-related values discussed above in Examples (1)-(4). The resistor temperature may correspond with, or represent, a specified temperature of interest, for example an operating temperature of one or more FETs near the temperature sense resistor 202, or a temperature at a particular location or area of the relevant chip or electronic device. For example, it may be determined (e.g., through modelling or test measurements) that the temperature of interest is sufficiently similar to the temperature of temperature sense resistor 202 to consider the temperature of temperature sense resistor 202 as an effective proxy for analyzing the temperature of interest, for example determining whether the temperature of interest has exceeded a defined unsafe or hazardous temperature threshold.

As used herein, analyzing a temperature may include (a) actually calculating a resistor temperature value or (b) analyzing at least one temperature-dependent resistance-related value as a proxy for the resistor temperature (e.g., any one or more of the example resistance-related values discussed above in Examples (1)-(4)), for example by comparing at least one temperature-dependent resistance-related value to a respective threshold value corresponding with a defined temperature state (e.g., a defined overheat state).

As noted above, temperature analysis circuitry 260 may control the resistor gate voltage $V_{GR}$ (by controlling resistor gate driver 250 tied to gate terminal 226) to improve the performance of temperature sensor 201. For example, temperature analysis circuitry 260 may apply and control $V_{GR}$ for any one or more of the following purposes:

(1) Temperature analysis circuitry 260 may selectively control the gate voltage $V_{GR}$ to increase the absolute resistance of the doped well region 204, thus increasing the absolute resistance of the conductive path CP passing through the doped (referred to herein as the conductive path resistance, or $R_{CP}$). Using the gate voltage $V_{GR}$ to increase the conductive path resistance $R_{CP}$ allows $R_{CP}$ to be measured using a lower sensing current ($I_{CP}$) for a given sensing voltage ($V_{T1}$), e.g., as compared with a prior art temperature sense resistor not including a control gate. Also, by providing a resistor gate 210 to increase the conductive path resistance $R_{CP}$ (by applying a gate voltage $V_{GR}$), the temperature sense resistor 202 may be formed with a reduced size of the doped well region 204 in at least one direction (e.g., y-direction length), to thereby reduce the layout area needed for the temperature sense resistor 202 e.g., as compared with a prior art temperature sense resistor not including a control gate. In some examples, the gate voltage $V_{GR}$ is applied in the ON state of the FETs, but not in the OFF state of the FETs. The feature of controlling the gate voltage $V_{GR}$ to increase $R_{CP}$ of the doped well region 204 is discussed in more detail below with reference to Table 1.

(2) Due to the gate voltage $V_{GR}$ being controllable independently from the FET gate voltage $V_{GFET}$, temperature analysis circuitry 260 may selectively control gate voltage $V_{GR}$ as a function of the FET state (e.g., ON vs OFF state) to reduce the dependence of the p-well resistance ($R_{CP}$) on the present FET state. In particular, the gate voltage $V_{GR}$ may be controlled based on the FET state to reduce the effect of the drain bias on the temperature sense resistor 202 by using the depletion from the resistor gate 210. The feature of controlling the gate voltage $V_{GR}$ to reduce the dependence of $R_{CP}$ on the FET state is discussed in more detail below with reference to Table 2.

(3) Temperature analysis circuitry 260 may control gate voltage $V_{GR}$ to influence the temperature coefficient of resistance (TCR) of temperature sense resistor 202. For example, temperature analysis circuitry 260 may increase $V_{GR}$, which increases the p-well resistance ($R_{CP}$), which in turn increases the TCR of resistor 202.

Example methods of using a temperature sensor (e.g., temperature sensor 201) to determine resistance-related value(s) corresponding with a conductive path CP of a temperature sense resistor (e.g., temperature sense resistor 202), analyzing a temperature based on the determined resistance-related value(s), and outputting a temperature-related signal $S_{temp}$ based on the analyzed temperature are discussed below with reference to FIGS. 10-12.

FIG. 3 is a top view of a portion of a MOSFET array 300 including the example temperature sensor 201 of FIGS. 2A-2C integrated in the MOSFET array 300, according to one example. As with FIGS. 2A-2C, the gate resistor gate driver 250 and temperature analysis circuitry 260 are illustrated schematically in FIG. 3.

As shown in FIG. 3, the MOSFET array 300 includes an array of FET cells 302 defined by a number of FET gates 310 formed over respective FET doped well regions 304 formed in a substrate 206 (e.g., an n-type SiC epitaxial substrate), with an FET source contact 306 formed on each doped well region 304 between an adjacent pair of FET gates 310. A JFET channel 316 is defined between each adjacent pair of FET doped well regions 304. FET gates 310 may be formed from polysilicon or metal (e.g., aluminum), and may be separated from underlying FET doped well regions 304 by an FET gate oxide 312, e.g., $SiO_2$ including a nitrogen dopant. FET source contacts 306 may be formed from aluminum or other metal. A gate voltage $V_{GFET}$ may be selectively applied to FET gates 310 by respective gate drivers (not shown), and a source voltage $V_{SFET}$ may be selectively applied to FET source contacts 306 by respective source drivers (not shown), The temperature sense resistor 202 of temperature sensor 201 is integrated in the MOSFET array 300. In particular, various structures of the temperature sense resistor 202 are formed in the same layers and/or simultaneous with various structures of the FET cells 302. For example, the doped well region 204 of temperature sense resistor 202 is formed in the same substrate 206 as FET doped well regions 304 (e.g., p-channels) of FET cells 302, and may be formed simultaneously with the doped well regions 304, i.e., using the same dopant and doping process. As another example, resistor gate 210 and resistor gate oxide 212 may be formed in the same layers (and thus from the same materials) as FET gates 310 and FET gate oxide 312, respectively.

In some examples, because the doped well region 204 is physically distinct from the FET doped well regions 304 of the FETs 302 in the array 300 (as shown in FIG. 3), the doped well region 204 of temperature sense resistor 202 may be formed with a lower dopant concentration than the FET doped well regions 304. This may provide improved performance of temperature sensor 201, e.g., as discussed below with reference to FIGS. 8 and 9A-9B.

As another example, the first and second sensor terminals 220, 222 and resistor gate terminal 226 of the temperature sense resistor 202 may formed in the same layer (and thus from the same material, e.g., aluminum) as FET source contacts 306. Further, in the example shown in FIG. 3, the second sensor terminal 222 is formed as a physical extension of a particular FET source contact 306, indicated at 306a, such that the second sensor terminal voltage $V_{T2}$ is tied to the voltage $V_{SFET}$ of FET source contact 306a. In contrast, the resistor gate voltage $V_{GR}$ applied to the resistor gate 210 may be controlled independently from the gate voltage $V_{GFET}$ applied to each FET gate 310, because the resistor gate 210 is physically distinct from FET gates 310. In particular, temperature analysis circuitry 260 controls driver 250 (using control signal Control $V_{GR}$) to apply a predetermined resistor gate voltage $V_{GR}$ to the resistor gate 210. (In other examples, e.g., as shown in FIGS. 4A-4B discussed below, the resistor gate voltage $V_{GR}$ is tied to the gate voltage $V_{GFET}$ of adjacent FET gates).

FIG. 4A is a top view of a portion of a MOSFET array 400 including an example temperature sensor 401 integrated in the MOSFET array 400, according to another example. The temperature sensor 401 includes a temperature sense resistor 402 and temperature analysis circuitry 460, which receives a voltage signal $Signal_{VGFET}$ from a FET gate driver 450. Temperature analysis circuitry 460 and FET gate driver 450 are illustrated schematically in FIG. 4A.

Figure 4B:
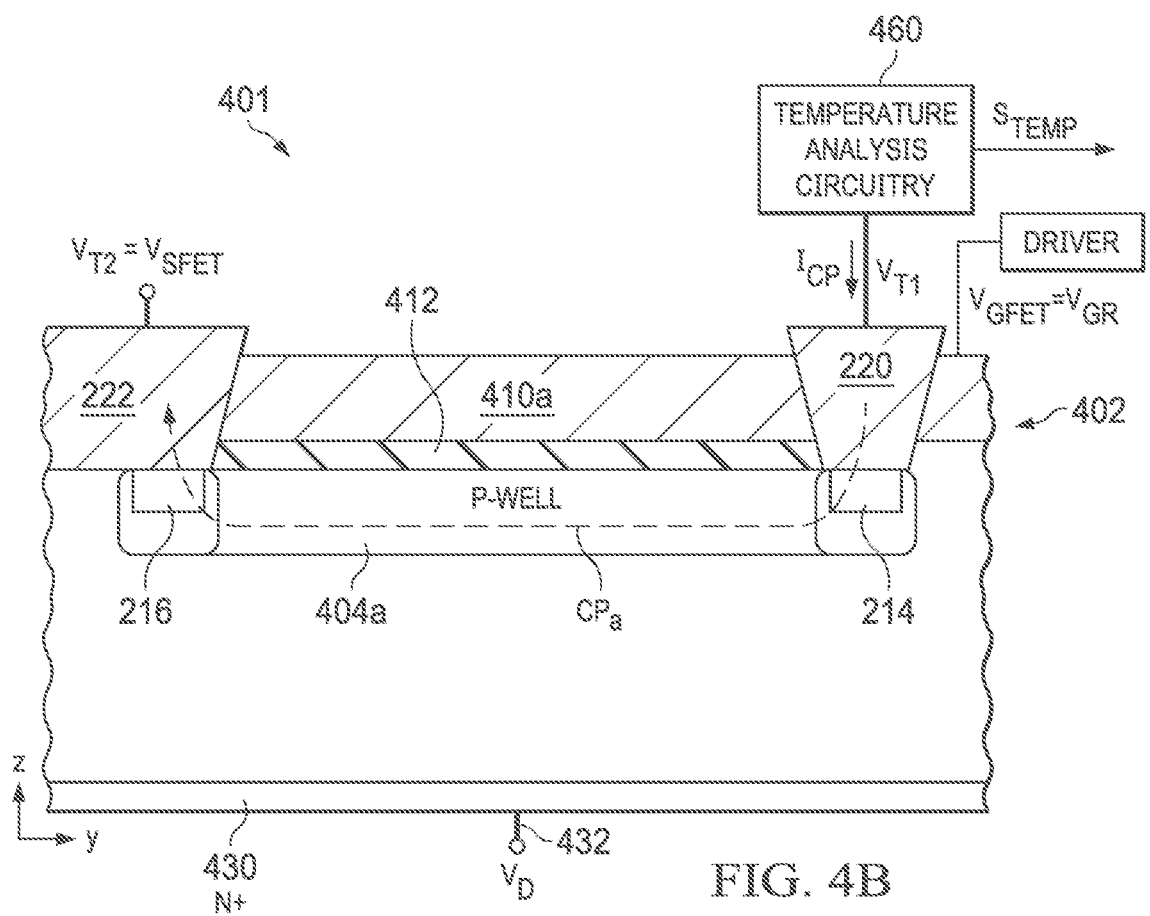
FIG. 4B illustrates a cross-sectional side view of the integrated temperature sensor shown in FIG. 4A.

FIG. 4B is a cross-sectional view of the temperature sense resistor 402 taken along the snaking cut line 4B-4B shown in FIG. 4A.

As shown in FIGS. 4A and 4B, the temperature sense resistor 402 includes (a) a resistor gate 410a/410b formed over a sensor doped well region 404 (or doped well region 404, for convenience) and separated from the doped well region 404 by a gate oxide 412, (b) a first sensor terminal 220 connected to the doped well region 404 by a first doped well tie 214, and (c) a second sensor terminal 222 connected to the doped well region 404 by a second doped well tie 216.

The resistor gate 410 includes (a) a first resistor gate region 410a defined by a physical extension of a first FET gate 310a and (b) a second resistor gate region 410b defined by a physical extension of a second FET gate 310b. Thus, the resistor gate voltage $V_{GR}$ is tied is tied to the gate voltage $V_{GFET}$ applied to FET gates 310a and 310b (by FET gate driver 450). Further, as with the temperature sense resistor 202 discussed above, the second sensor terminal 222 is formed as a physical extension of a particular FET source contact 306, indicated at 306a, such that the second sensor terminal voltage $V_{T2}$ is tied to the voltage $V_{SFET}$ of FET source contact 306a.

Thus, temperature sensor 401 is generally similar to temperature sensor 201 discussed above with reference to FIGS. 2A-2C and FIG. 3, with a key difference that the resistor gate 410 of the controllable temperature sense resistor 402 is defined by respective extensions of a pair of adjacent FET gates 310a and 310b (defining two parallel resistors along conductive paths $CP_a$ and $CP_b$ as discussed below), such that the resistor gate voltage $V_{GR}$ is tied is tied to the gate voltage $V_{GFET}$ of FET gates 310a and 310b, unlike temperature sensor 201 in which the resistor gate voltage $V_{GR}$ is controllable independently from FET gates 310 in the FET array 300.

As shown in FIG. 4A, the doped well region 404 includes (a) a first doped well region 404a aligned under the first resistor gate region 410a, a second doped well region 404b aligned under the second resistor gate region 410b, a first doped well tie 214 located under the first sensor terminal 220, and a second doped well tie 216 located under the second sensor terminal 222. As discussed above, the first doped well tie 214 provides a conductive contact between the first sensor terminal 220 and doped well region 404, and the second doped well tie 216 provides a conductive contact between the second sensor terminal 222 and doped well region 404.

As shown, the doped well region 404 is physically separate from the adjacent FET doped well regions 304. In some examples, doped well region 404 may be formed with the same dopant concentration as FET doped well regions 304; for example, doped well region 404 and FET doped well regions 304 may be doped concurrently. In other examples, doped well region 404 may be formed with a different dopant concentration (e.g., a higher or lower dopant concentration) than FET doped well regions 304, e.g., by forming doped well region 404 in a separate step from FET doped well regions 304. For example, in some examples doped well region 404 may be formed with a lower dopant concentration than FET doped well regions 304, to provide a higher sheet resistance of the doped well region 404, which may provide improved temperature detection.

In the illustrated example, the first and second doped well regions 404a and 404b are separated from each other by an undoped region 420 of the substrate 206, thereby defining a ring-shaped doped well region 404, from the top view shown in FIG. 4A. In another example (not shown), the doped well region 404 may be formed with a rectangular shape from the top view, i.e., wherein the undoped region 420 shown in FIG. 4A is included in the doped well region 404.

As shown in FIG. 4A, the ring-shaped doped well region 404 defines a conductive path including (a) a first conductive path component $CP_a$ passing through first doped well region 404a and (b) a second conductive path component $CP_b$ passing through second doped well region 404b, wherein the first and second conductive path components $CP_a$ and $CP_b$ define electrically parallel paths. The cross-sectional view of FIG. 4B shows the first conductive path component $CP_a$ passing through the first doped well region 404a and connected to the first and second sensor terminals 220 and 220 through doped well ties 214 and 216, respectively.

Unlike the example temperature sensor 201 discussed above regarding FIGS. 2A-2C (and FIG. 3) in which temperature analysis circuitry 260 controls the resistor gate voltage $V_{GR}$ independently from the FET gate voltage $V_{GFET}$, the resistor gate voltage $V_{GR}$ of temperature sense resistor is controlled by (equal to) the FET gate voltage $V_{GFET}$.

However, although not independently controllable from the FET gate voltage $V_{GFET}$, the resistor gate voltage $V_{GR}$ (which is applied during the FET-ON state) increases the absolute resistance of the doped well region 404, and thus increases the respective resistance $R_{CP}$ of conductive paths $CP_a$ and $CP_b$ extending through doped well regions 404a and 404b, respectively. Using the gate voltage $V_{GR}$ to increase the conductive path resistance $R_{CP}$ allows $R_{CP}$ to be measured using a lower sensing current ($I_{CP}$) for a given sensing voltage ($V_{T1}$), e.g., as compared with a prior art temperature sense resistor not including a control gate. Also, by providing the resistor gate 410 to increase the conductive path resistance $R_{CP}$, the temperature sense resistor 402 may be formed with a reduced size of the doped well region 404 in at least one direction (e.g., y-direction length), to thereby reduce the layout area needed for the temperature sense resistor 402 e.g., as compared with a prior art temperature sense resistor not including a control gate. An example scenario illustrating this feature is discussed below with reference to Table 1.

FIGS. 5A and 5B illustrate circuit diagrams corresponding with portions of two example MOSFET arrays. First, FIG. 5A provides a circuit diagram for a portion of an example MOSFET array including a temperature sense resistor and a nearby FET, wherein the resistor gate of the temperature sense resistor is independently controllable from FET gates in the array, for example as provided in the example MOSFET array 300 shown in FIG. 3. Thus, the resistor gate voltage $V_{GR}$ may be controlled independently from the FET gate voltage $V_{GFET}$. The doped well region of the temperature sense resistor may be distinct from the FET doped well regions, e.g., as shown in the example MOSFET array 300 shown in FIG. 3. Thus, the dimensions (e.g., width and length) of the resistor doped well region may differ from the corresponding dimensions of the FET doped well regions in the array.

As shown in FIG. 5A, the voltage $V_{T2}$ at the second sensor terminal T2 is equal to the FET source voltage $V_{SFET}$, because the second sensor terminal is formed as a physical extension of the FET source line. To perform an example temperature measurement, a current $I_{CP}$ may be applied at the first sensor terminal $V_{T1}$, the resulting voltage $V_{T1}$ may be measured to determine a voltage drop between $V_{T1}$ and $V_{T2}$, with $V_{T2}$ being a known value, illustrated as ground, the resistance $R_{CP}$ may be calculated based on the current $I_{CP}$ and voltage drop $V_{T1}-V_{T2}$, and a temperature may then be determined based on the calculated resistance $R_{CP}$.

Next, FIG. 5B provides a circuit diagram for a portion of an example MOSFET array including a temperature sense resistor and a nearby FET, according to another example. The example configuration shown in FIG. 5B is similar to the configuration shown in FIG. 5A, except the resistor gate of the temperature sense resistor in FIG. 5B is tied to FET gates in the array, for example as provided in the example MOSFET array 400 shown in FIG. 4A. Thus, the resistor gate voltage $V_{GR}$ is equal to the FET gate voltage $V_{GFET}$. The resistor doped well region may be located between a pair of FET p-channels on opposite sides of the resistor doped well region (in the x-axis direction shown in FIG. 4A), and thus the width of the resistor doped well region (in the x-axis direction) may be defined or limited by the distance between the pair of FET doped well regions (e.g., p-channels).

Similar to the example configuration shown in FIG. 5A, the voltage $V_{T2}$ at the second sensor terminal T2 is equal to the FET source voltage $V_{SFET}$. Also similar to the example configuration of FIG. 5A, an example temperature measurement may be performed by applying a current $I_{CP}$ at the first sensor terminal $V_{T1}$, measuring the resulting voltage $V_{T1}$ to determine a voltage drop $V_{T1}-V_{T2}$, with $V_{T2}$ being a known value, illustrated as ground, calculating $R_{CP}$ based on the current $I_{CP}$ and voltage drop $V_{T1}-V_{T2}$, and determining a temperature based on the calculated resistance $R_{CP}$.

Figure 6A:
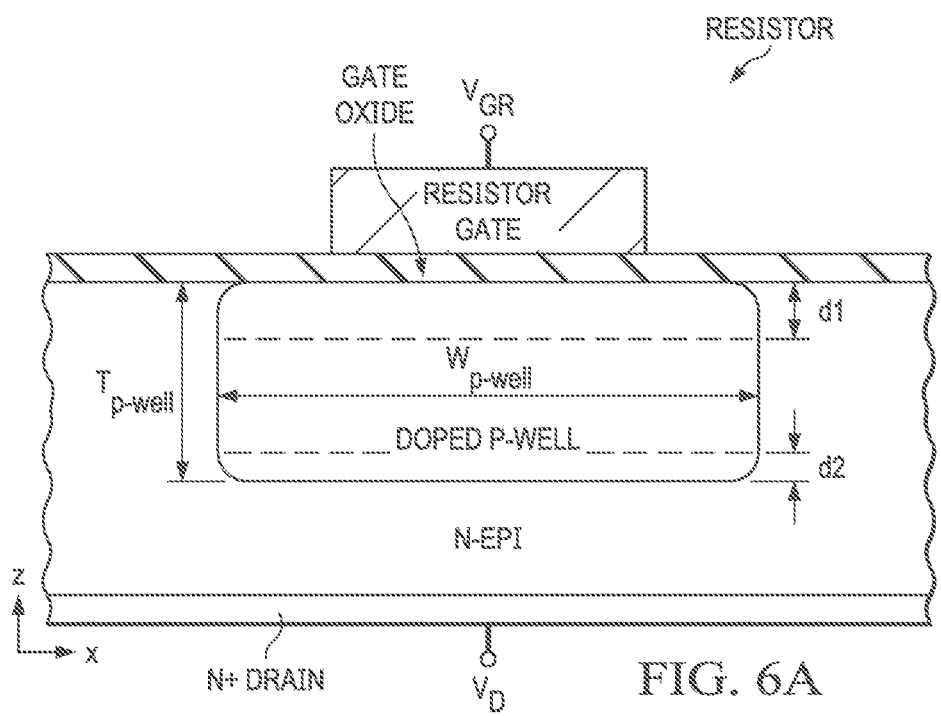
FIGS. 6A and 6B illustrate cross-sectional views of an example temperature sense resistor integrated in a FET array, showing various dimension relevant to the p-well resistance of the temperature sense resistor.
Figure 6B:
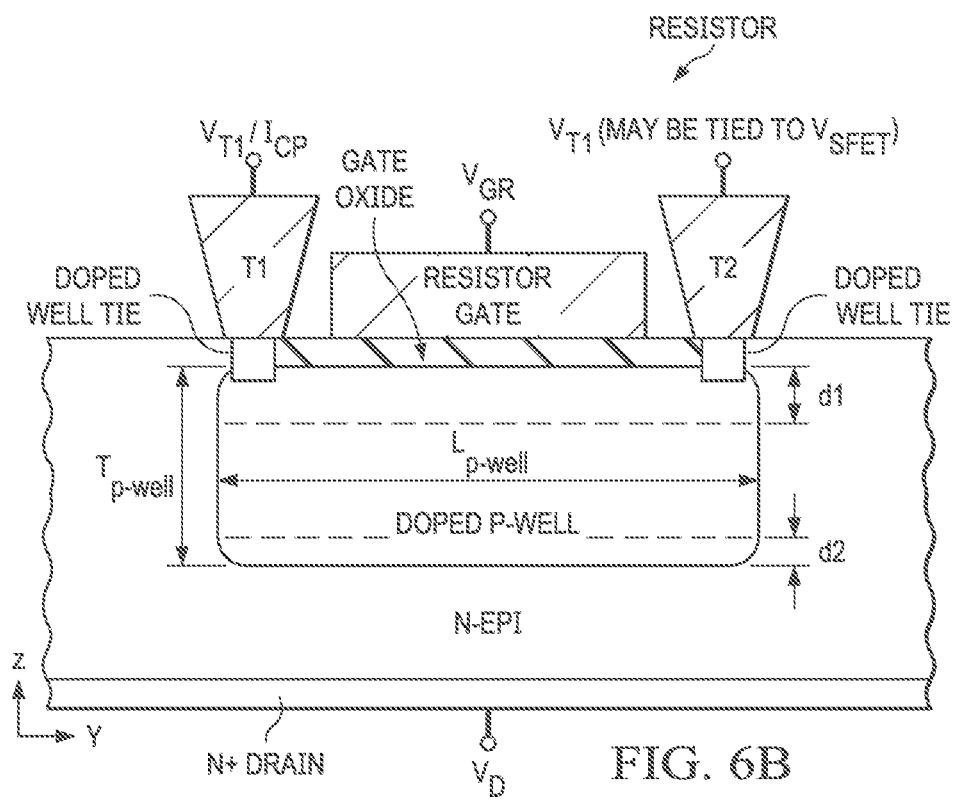

FIGS. 6A and 6B illustrate cross-sectional views of an example temperature sense resistor integrated in a FET array, e.g., the example resistor 302 or 402 discussed above. The resistance of the doped p-well region ($R_{CP}$), which represents the resistance of the temperature sense resistor, is determined by following equation:

$$R_{CP} = R_{sheet\_p\text{-}well} * L_{p\text{-}well} / (W_{p\text{-}well} * (T_{p\text{-}well} - d1 - d2)) + R_{contact} \qquad (1)$$

Wherein
$R_{sheet\_p\text{-}well}$ represents the p-well sheet resistance (controlled by the doping concentration);

d1 represents the depletion region from the resistor gate voltage $V_{GR}$ (i.e., the region "depleted" of free charge);
d2 represents the depletion region from the drain voltage $V_D$;
$L_{p\text{-}well}$, $W_{p\text{-}well}$, and $T_{p\text{-}well}$ represent the length, width, and thickness of the doped p-well, as shown in FIGS. 6A-6B; and
$R_{contact}$ represents the sum of (a) contact resistance between the doped p-well region and first sensor terminal T1 and (b) contact resistance between the doped p-well region and second sensor terminal T2. $R_{contact}$ may constitute a negligible component of $R_{CP}$.

According to Equation (1), the resistance $R_{CP}$ is dependent on the depletion regions d1 and d2; in particular, $R_{CP}$ increases as d1 or d2 increases. Depletion region d1 is controlled by the resistor gate voltage $V_{GR}$, which may be independently controllable from, or tied to, the FET gate voltage $V_{GFET}$, depending on the particular integration of the temperature sense resistor in the FET array. Depletion region d1 is proportional to the square root of $V_{GR}$. Depletion region d2 is controlled by the drain voltage $V_D$, which is applied in both the ON state and OFF state of the FET, but not in the standby (i.e., powered down) state of the FET.

As discussed above, the resistor gate voltage $V_{GR}$ may be selectively controlled to improve the operation of an integrated temperature sensor including a resistor having a controllable gate, as disclosed herein (e.g., temperature sensors 201 and 401 discussed above). For example, as discussed above, a resistor gate voltage $V_{GR}$ may be applied to the resistor gate to increase the absolute p-well resistance, $R_{CP}$, which may improve resistance sensing (e.g., by allowing a reduced current $I_{CP}$ for a given sensing voltage $V_{T1}$).

Table 1 illustrates the operation of example temperature sense resistor 202 including resistor gate 210 (see FIGS. 2A-2C and FIG. 3) or example temperature sense resistor 402 including resistor gate 410 (see FIGS. 4A-4B), as compared with a conventional temperature sense resistor without a control gate. In particular, Table 1 shows how biasing the resistor gate 210 or 410 with a gate voltage $V_{GR}$ in the ON state of the FET ("FET-ON" state), referred to as $V_{GR\_FET\_ON}$, increases the measured resistance of the resistor p-well ($R_{CP\_FET\_ON}$), as compared with the p-well resistance of a conventional temperature sense resistor without a control gate ($R_{no\_gate}$). This increase in $R_{CP\_FET\_ON}$ may allow for (a) a reduced sensing current for a given sensing voltage applied to the first sensor terminal 220 (of temperature sense resistor 202) or first sensor terminal 220 (of temperature sense resistor 402) and/or (b) a reduced length of the resistor p-well (in the y-axis direction shown in FIGS. 2A-4B), thus reducing the required area for the respective temperature sense resistor 202 or 402 in the relevant IC structure as compared to the prior art.

TABLE 1

Using $V_{GR}$ to increase $R_{CP}$ of temperature sense resistor including a control gate, as compared with a conventional temperature sense resistor without a control gate.

| Temperature Sense Resistor Design | FET state | Bias Conditions | d1 | d2 | $R_{CP}$ |
|---|---|---|---|---|---|
| Temperature sense resistor with no resistor gate | ON | $V_{GFET}$ and $V_D > 0$ V (specified voltages for each) | d1→0 | d2→0 | $R_{no\_gate}$ |
| Temperature sense resistor including resistor control gate (e.g., temperature sense Resistor 202 or 402) | ON | $V_{GFET}$, $V_D$, and $V_{GR\_FET\_ON} > 0$ V (specified voltages for each) | d1 > 0 | d2→0 | $R_{CP\_FET\_ON} > R_{no\_gate}$ |

Figure 7:
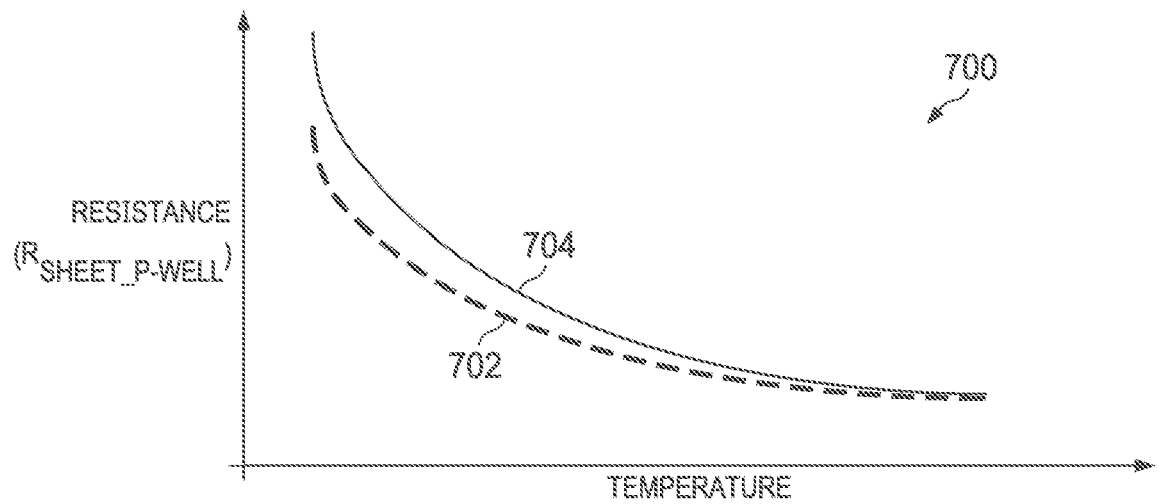
FIG. 7 shows an example graph illustrating a relationship between p-well temperature and p-well resistance, for temperature sense resistors with and without a controllable gate.

FIG. 7 shows an example graph 700 illustrating the relationship between p-well temperature and p-well resistance of a temperature sense resistor, for temperature sense resistors with and without a controllable gate. A first curve 702 indicates an example temperature-resistance curve for a conventional temperature sense resistor not including a control gate. For example, with reference to Table 1, curve 702 indicates the effect of temperature on the resistance $R_{no\_gate}$ indicated in the top row of Table 1. A second curve 704 indicates an example temperature-resistance curve for a temperature sense resistor including a control gate according to examples of the present disclosure, e.g., temperature sense resistor 202 including resistor gate 210 or temperature sense resistor 402 including resistor gate 410. For example, with reference to Table 1, curve 704 indicates the effect of temperature on the resistance $R_{CP\_FET\_ON}$ indicated in the bottom row of Table 1. As shown, the resistance $R_{CP\_FET\_ON}$ provided by the temperature sense resistor including a resistor gate (e.g., temperature sense resistor 202 or 402) is higher than the resistance $R_{no\_gate}$ for any given temperature. This may improve the performance of the respective temperature sensor including such temperature sense resistor, e.g., example temperature sensor 201 or 401 discussed above. It is noted that second curve 704 exhibits a higher slope than first curve 702, as the addition of the resistor gate 210, 410 increases the TCR of temperature sense resistor 202, 402, respectively.

Further, as discussed above, for the example temperature sense resistor 202—in which the gate voltage $V_{GR}$ is controllable independently from the respective FET gate voltage $V_{GFET}$—the resistor gate voltage $V_{GR}$ may be selectively controlled as a function of the current FET state, (e.g., ON or OFF) to reduce the dependence of $R_{CP}$ on the current FET state. For example, temperature analysis circuitry 260 may apply a first predetermined resistor gate voltage $V_{GR\_FET\_ON}$ in the ON state of the FET ("FET-ON" state), and a different second predetermined resistor gate voltage $V_{GR\_FET\_OFF}$ in the OFF state of the FET ("FET-OFF" state), wherein the difference between $V_{GR\_FET\_ON}$ and $V_{GR\_FET\_OFF}$ reduces or minimize a difference between the measured p-well resistance of resistor 202 in the FET-ON state ($R_{CP\_FET\_ON}$) and the FET-OFF ($R_{CP\_FET\_OFF}$).

Table 2 illustrates operation of the example temperature sense resistor 202 wherein the gate voltage $V_{GR}$ is controllable independently from the FET gate voltage $V_{GFET}$. In particular, Table 2 shows an example in which temperature analysis circuitry 260 applies a positive resistor gate voltage $V_{GR}$ in the FET-ON state ($V_{GR\_FET\_ON} > 0$), but not in the OFF state of the FET ($V_{GR\_FET\_OFF} = 0$).

TABLE 2

Using $V_{GR}$ to reduce a dependence of the measured resistance on the FET state, in a temperature sense resistor including a control gate independent of the FET control gate.

| FET state | Bias Conditions | d1 | d2 | $R_{CP}$ |
|---|---|---|---|---|
| Standby | $V_D = V_{GR} = 0$ V | d1~0 | d2~0 | $R_{CP\_FET\_Standby}$ |
| OFF | $V_{GFET} = V_{GR\_FET\_OFF} = 0$ V; $V_D > 0$ V (specified drain voltage) | d1~0 | d2 > 0 | $R_{CP\_FET\_OFF} > R_{CP\_FET\_Standby}$ |
| ON | $V_{GFET}$, $V_D$, and $V_{GR\_FET\_ON} > 0$ V (specified voltages for each) | d1 > 0 | d2~0 | $R_{CP\_FET\_ON} \sim R_{CP\_FET\_OFF}$ |

As shown in Table 2, in the FET-OFF state, the FET drain voltage ($V_D$) is applied, while $V_{GR}$ and $V_{GFET}$ are held at ground potential (i.e., $V_{GR\_FET\_OFF} = V_{GFET} = 0V$), and the resulting resistor p-well resistance ($R_{CP\_FET\_OFF}$) is greater than the resistor p-well resistance in the FET-Standby (i.e., power down) state ($R_{CP\_FET\_Standby}$).

Further shown in Table 2, in the FET-ON state, an FET gate voltage ($V_{GFET}$) is applied at a specified FET drive potential, which switches the FET to its conductive state. In addition, a specified resistor gate voltage $V_{GR}$ is applied (i.e., $V_{GR\_FET\_ON} > 0$) to the resistor gate 210, which brings the resulting resistor p-well resistance $R_{CP\_FET\_ON}$ closer to the FET-OFF state p-well resistance $R_{CP\_FET\_OFF}$, as compared with applying no resistor gate voltage (i.e., $V_{GR\_FET\_ON} = 0$) and as compared with a conventional temperature sense resistor that does not include a resistor gate. In particular, the applied $V_{GR\_FET\_ON}$ may provide a net depletion region (d1+d2) in the FET-ON state that approaches the net depletion region (d1+d2) in the FET-OFF state, to thereby reduce differences in the absolute resistance value between the different states of FET operation.

In some examples, $V_{GR\_FET\_OFF}$ is zero, while $V_{GR\_FET\_ON}$ is a non-zero voltage, e.g., in the range 2V-10V. In other examples, $V_{GR\_OFF}$ and $V_{GR\_ON}$ are different non-zero voltages. For example, $V_{GR\_FET\_OFF}$ may be set at a first non-zero voltage, while $V_{GR\_FET\_ON}$ is set at a second voltage equal to $V_{GR\_FET\_OFF}$ plus a differential voltage in the range 2V-10V.

In some examples, the value of $V_{GR\_FET\_ON}$ may be selected such that $R_{CP\_FET\_ON}$ differs from $R_{CP\_FET\_OFF}$ by less than 15%, or less than 10%, or less than 5%, depending on the particular example. In some examples, the selected value of $V_{GR\_FET\_ON}$ that provides such result may be determined by a calibration process performed during wafer testing.

In addition, for a group of temperature sense resistors 202, for example on the same wafer on across multiple wafers, the gate voltage $V_{GR}$ of each temperature sense resistor 202 can be tuned to reduce fabrication-related variations in the p-well resistance ($R_{CP}$) across the various temperature sense resistors 202. For example, process-related variations in the P-well ion-implant, e.g., variations in the p-well patterning, or variations in the thermal activation of the implants across a wafer or between wafer lots, may result in variations in $R_{CP}$ between the different temperature sense resistors 202. In some examples, the temperature analysis circuitry 260 connected to each respective temperature sense resistor 202 may determine a baseline $V_{GR}$ value for the respective temperature sense resistor 202 that reduces the variations in $R_{CP}$ across the different temperature sense resistors 202. The temperature analysis circuitry 260 connected to each respective temperature sense resistor 202 may apply the determined baseline $V_{GR}$ value to the respective temperature sense resistor 202 as a constant baseline voltage. The different baseline $V_{GR}$ values applied to the different temperature sense resistors 202 may reduce the process-related variations in $R_{CP}$ across the different temperature sense resistors 202, thereby improving the accuracy of the temperature analysis performed using each temperature sense resistors 202.

Figure 8:
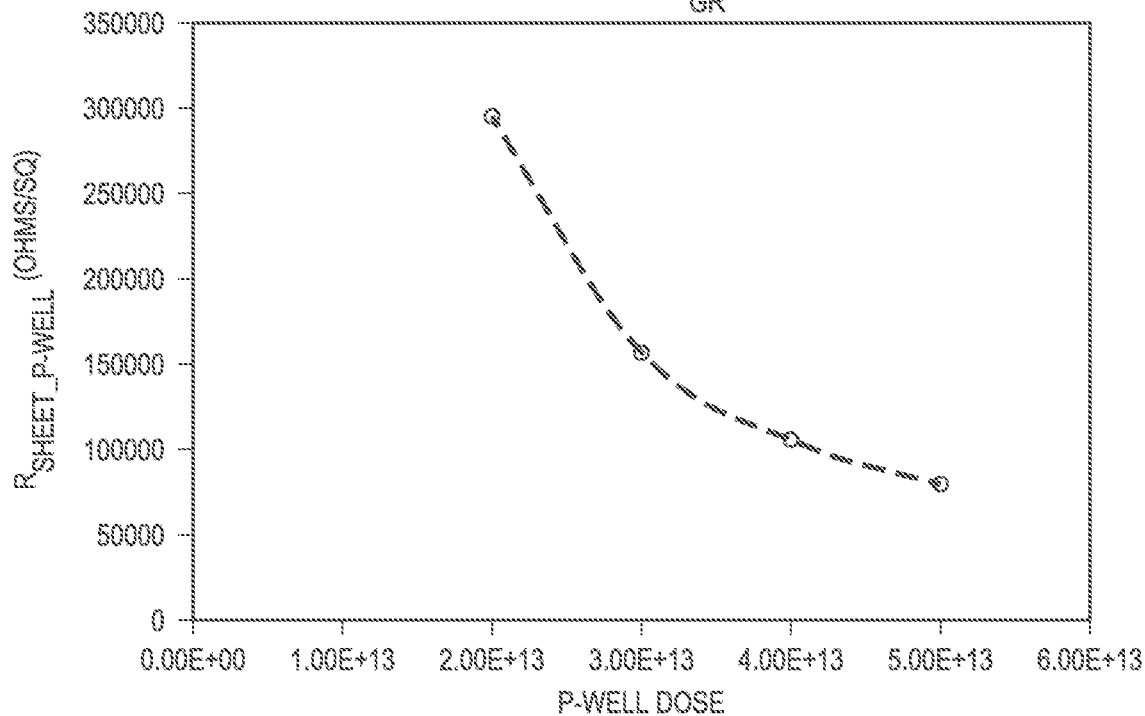
FIG. 8 shows a graph illustrating an example relationship between the p-well sheet resistance and implant dosing of the doped p-well region of a temperature sense resistor.

FIG. 8 shows a graph illustrating an example relationship between the p-well sheet resistance ($R_{sheet\_p-well}$ in Equation (1) above) and the implant dopant concentration of the doped p-well region for a temperature sense resistor, at 25° C. and with $V_{RG} = 0V$.

Further, FIGS. 9A and 9B show graphs 900a and 900b, respectively, illustrating example relationships between p-well sheet resistance ($R_{sheet\_p-well}$) and resistor gate voltage $V_{GR}$. First, FIG. 9A shows an example curve 902a of $R_{sheet\_p-well}$ versus $V_{GR}$ for an example temperature sense resistor 202 with a doped p-well region 204 formed with a lower p-well dopant concentration (1e13/cm$^2$), and a corresponding curve 904a showing a rate-of-change change (percentage change) of curve 902a. Second, FIG. 9B shows an example curve 902b of $R_{sheet\_p-well}$ versus $V_{GR}$ for an example temperature sense resistor 202 with a doped p-well region 204 formed with a higher p-well implant dopant concentration (5e13/cm$^2$), and a corresponding curve 904b showing a rate-of-change change (percentage change) of curve 902b. As shown by comparing graphs 900a and 900b, the lower p-well implant dopant concentration provides much higher p-well sheet resistance and resistance rate-of-change for given resistor gate voltages $V_{GR}$.

Thus, based on the above, a low or reduced dopant concentration for the temperature sense resistor doped p-well region may be used to provide improved temperature analysis. For example, for the example temperature sense resistor 202, because the doped p-well region 204 is physically distinct from the FET doped p-well regions 304 of the FETs 302 in the array 300 (as shown in FIG. 3), the doped p-well region 204 of temperature sense resistor 202 may be formed with a lower dopant concentration than the FET p-well regions 304.

Figure 10:
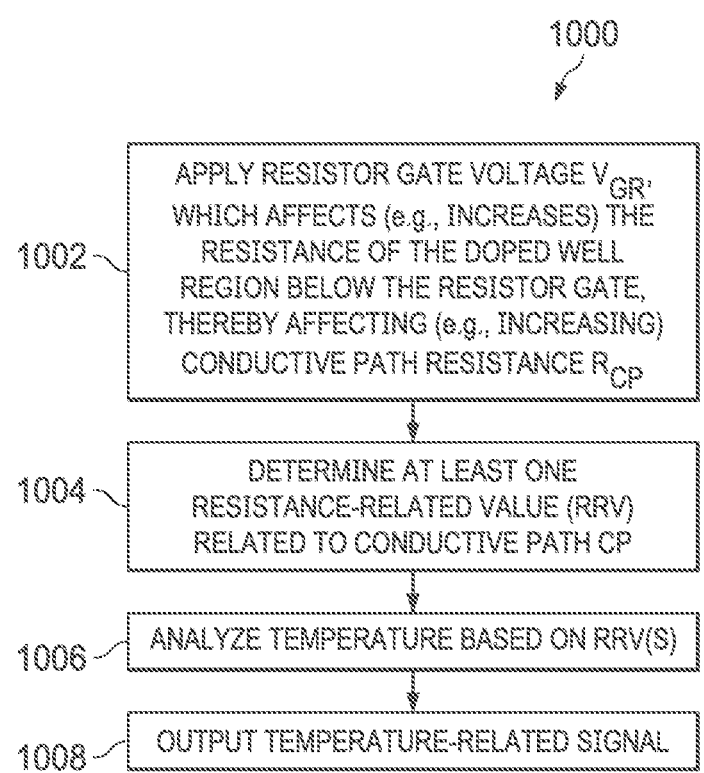
FIGS. 10-12 illustrate example methods of using a temperature sensor (to determine resistance-related value(s) corresponding with a conductive path of an integrated temperature sense resistor, analyzing a temperature based on the determined resistance-related value(s), and outputting a temperature-related signal based on the analyzed temperature.
Figure 11:
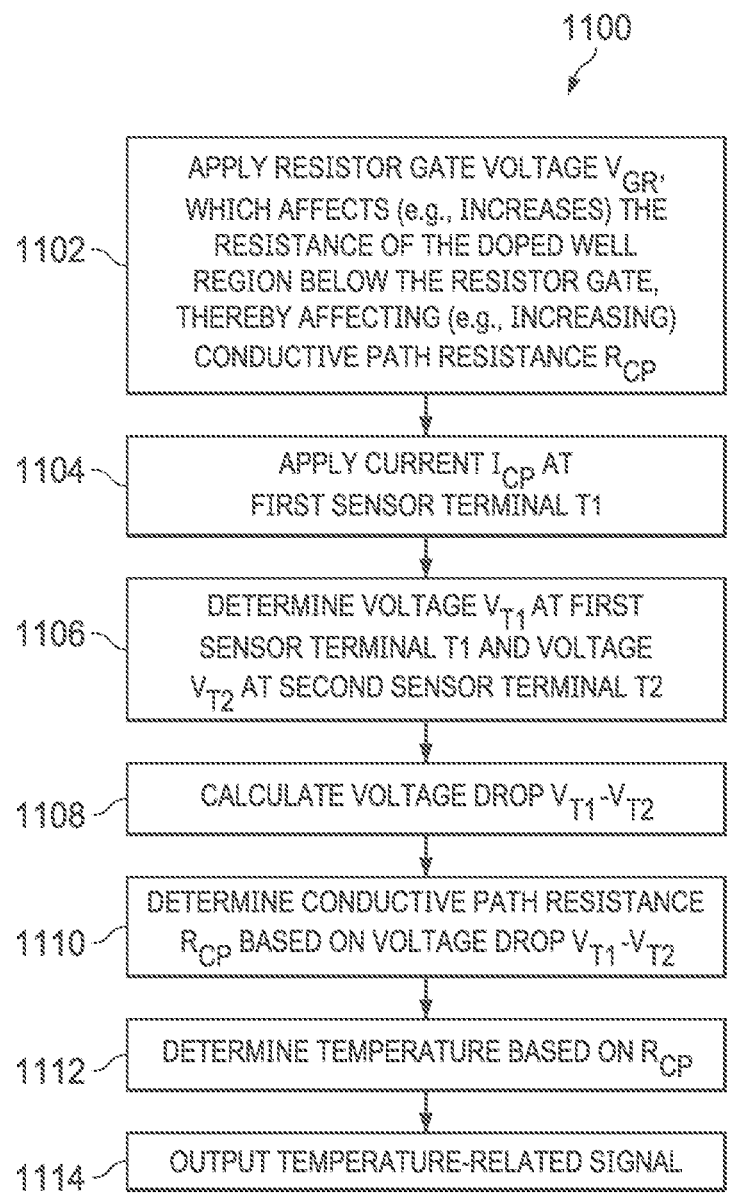
Figure 12:
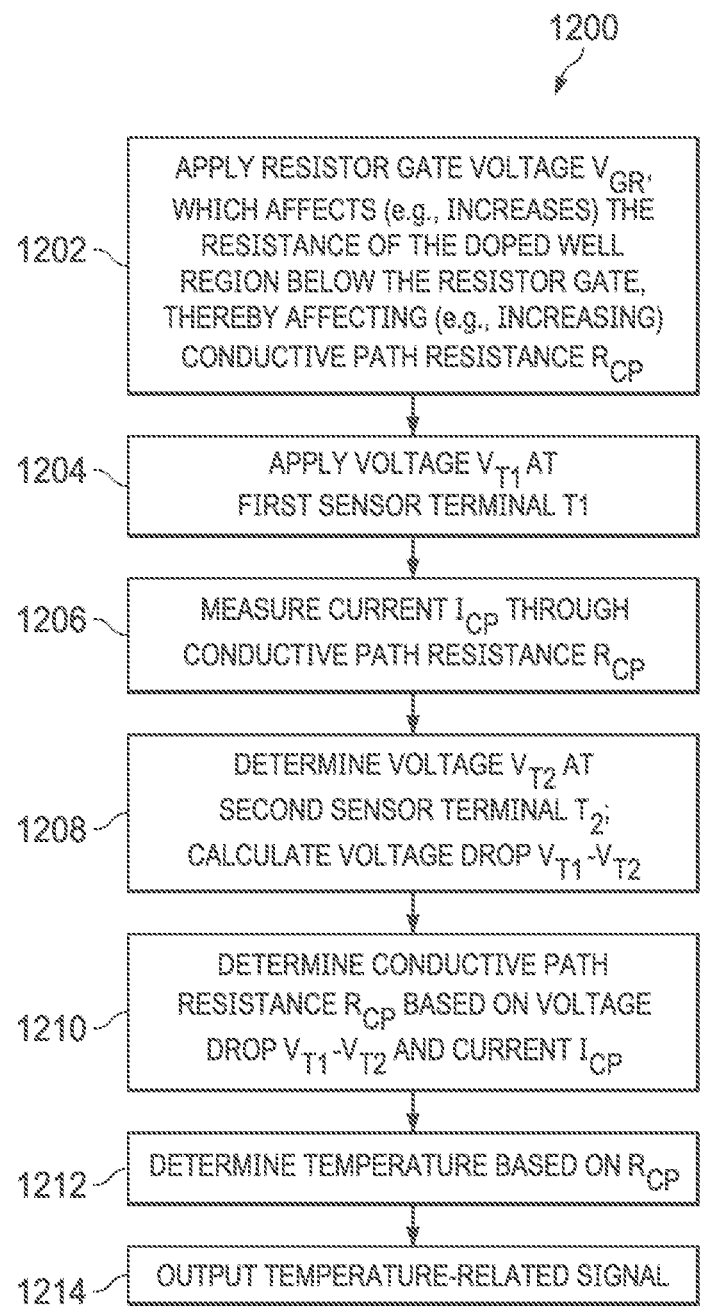

FIGS. 10-12 illustrate example methods of using a temperature sensor (e.g., temperature sensor 201 or 401) to determine resistance-related value(s) corresponding with a conductive path CP of an integrated temperature sense resistor (e.g., temperature sense resistor 202 integrated in FET array 200, or temperature sense resistor 402 integrated in FET array 400), analyzing a temperature based on the determined resistance-related value(s), and outputting a temperature-related signal $S_{temp}$ based on the analyzed temperature.

FIG. 10 shows an example method 1000 for analyzing a temperature associated with a FET array using a temperature sensor including a temperature sense resistor, e.g., temperature sensor 201 including temperature sense resistor 202 or temperature sensor 401 including temperature sense resistor 402. At 1002, a voltage $V_{GR}$ is applied to the resistor gate, which affects (e.g., increases) a resistance of the doped well region below the resistor gate, thereby affecting (e.g., increasing) the conductive path resistance $R_{CP}$. In the example temperature sensor 201 in which $V_{GR}$ is controllable independently from $V_{GFET}$, voltage $V_{GR}$ may be selected and applied by temperature analysis circuitry 260. In the example temperature sensor 401 in which $V_{GR}$ is tied to $V_{GFET}$, voltage $V_{GR}$ is applied in conjunction with $V_{GFET}$.

At 1004, the temperature analysis circuitry (e.g., temperature analysis circuitry 260 of temperature sensor 202, or temperature analysis circuitry 460 of temperature sensor 402) determines at least one resistance-related value (RRV) related to the conductive path CP. As discussed above regarding FIGS. 2A-2C, a resistance-related value may comprise a resistance $R_{CP}$ of the conductive path CP, or a parameter value related to the conductive path resistance $R_{CP}$. In some examples, the temperature analysis circuitry determines at least one RRV based on a current $I_{CP}$ and voltage drop $V_{T1}$-$V_{T2}$ across the conductive path CP passing through the temperature sense resistor doped well region, as discussed below with reference to FIGS. 11-12.

At 1006, the temperature analysis circuitry determines or otherwise analyzes a temperature associated with the FET array based on the determined resistance-related value(s). The feature of analyzing a temperature based on resistance-related value(s) is discussed above regarding FIGS. 2A-2C.

At 1008, the temperature analysis circuitry may output a temperature-related signal $S_{temp}$ based on the analyzed temperature. For example, the temperature analysis circuitry may transmit a signal $S_{temp}$ indicating temperature data to a display device, processor, or storage device (or to a contact or transmitter to send such signal $S_{temp}$ for receipt by a display device (to display the temperature data), a processor (e.g., to further analyze the temperature data), or a storage device (to store the temperature data).

As another example, the temperature analysis circuitry may determine a temperature-based condition or event based on the analyzed temperature (e.g., by detecting a temperature exceeding or falling below a predetermined threshold value), and transmit a signal $S_{temp}$ indicating the temperature-based condition or event to a display device, processor, or storage device (or to a contact or transmitter to send such signal $S_{temp}$ for receipt by a display device (to display an alert or other information associated with the temperature-based condition or event), a processor (e.g., to further analyze the $S_{temp}$ data), or a storage device (to store the $S_{temp}$ data).

FIG. 11 shows another example method 1100 for analyzing a temperature associated with a FET array using a temperature sensor including a temperature sense resistor, e.g., temperature sensor 201 including temperature sense resistor 202 or temperature sensor 401 including temperature sense resistor 402. At 1102, a resistor gate voltage $V_{GR}$ is applied, which affects (e.g., increases) a resistance of the resistor doped well region below the resistor gate, thereby affecting (e.g., increasing) the conductive path resistance $R_{CP}$. In the example temperature sensor 201 in which $V_{GR}$ is controllable independently from $V_{GFET}$, voltage $V_{GR}$ may be selected and applied by temperature analysis circuitry 260. In the example temperature sensor 401 in which $V_{GR}$ is tied to $V_{GFET}$, voltage $V_{GR}$ is applied in conjunction with $V_{GFET}$.

At 1104, the temperature analysis circuitry of the respective temperature sensor (e.g., temperature analysis circuitry 260 of temperature sensor 202, or temperature analysis circuitry 460 of temperature sensor 402) applies a predetermined current $I_{CP}$ along the conductive path CP passing through the temperature sense resistor doped well region. In one example, the predetermined current $I_{CP}$ is applied at the first sensor terminal T1.

At 1106, the temperature analysis circuitry measures a voltage $V_{T1}$ at the first sensor terminal T1 and measures (or accesses) a voltage $V_{T2}$ at the second sensor terminal T2. At 1108, the temperature analysis circuitry calculates a voltage drop $V_{T1}$-$V_{T2}$ across the resistor doped well region. Voltage $V_{T2}$ at the second sensor terminal T2 may a predetermined voltage, and therefore the value need not be measured.

At 1110, the temperature analysis circuitry determines a conductive path resistance $R_{CP}$ based on the voltage drop $V_{T1}$-$V_{T2}$ and the predetermined current $I_{CP}$.

At 1112, the temperature analysis circuitry determines or otherwise analyzes a temperature associated with the FET array based on the determined conductive path resistance $R_{CP}$.

At 1114, the temperature analysis circuitry may output a temperature-related signal $S_{temp}$ based on the analyzed temperature, for example similar to step 1008 discussed above with respect to FIG. 10.

FIG. 12 shows another example method 1200 for analyzing a temperature associated with a FET array using a temperature sensor including a temperature sense resistor, e.g., temperature sensor 201 including temperature sense resistor 202 or temperature sensor 401 including temperature sense resistor 402. At 1202, a resistor gate voltage $V_{GR}$ is applied, which affects (e.g., increases) a resistance of the temperature sense resistor doped well region, thereby affecting (e.g., increasing) the conductive path resistance $R_{CP}$. In the example temperature sensor 201 in which $V_{GR}$ is controllable independently from $V_{GFET}$, voltage $V_{GR}$ may be selected and applied by temperature analysis circuitry 260. In the example temperature sensor 401 in which $V_{GR}$ is tied to $V_{GFET}$, voltage $V_{GR}$ is applied in conjunction with $V_{GFET}$.

At 1204, the temperature analysis circuitry of the respective temperature sensor (e.g., temperature analysis circuitry 260 of temperature sensor 202, or temperature analysis circuitry 460 of temperature sensor 402) applies a predetermined voltage $V_{T1}$ at the first sensor terminal T1.

At 1206, the temperature analysis circuitry measures the current $I_{CP}$ along the conductive path CP, e.g., using suitable circuitry connected to the first sensor terminal T1 (e.g., included in the temperature analysis circuitry). At 1208, the temperature analysis circuitry measures or otherwise determines the voltage $V_{T2}$ at the second sensor terminal T2, and calculates the voltage drop $V_{T1}-V_{T2}$ across the resistor doped well region.

At 1210, the temperature analysis circuitry determines, or otherwise calculates, a conductive path resistance $R_{CP}$ based on the voltage drop $V_{T1}-V_{T2}$ and the current $I_{CP}$. At 1212, the temperature analysis circuitry determines or otherwise analyzes a temperature associated with the FET array based on the determined conductive path resistance $R_{CP}$. Finally, at 1214, the temperature analysis circuitry may output a temperature-related signal $S_{temp}$ based on the analyzed temperature, for example similar to step 1008 discussed above with respect to FIG. 10.

The invention claimed is:

1. A temperature sensor integrated in a transistor array, the temperature sensor comprising:
 a temperature sense resistor comprising:
  a doped well region formed in a substrate;
  a resistor gate formed over the doped well region and separated from the doped well region by a gate oxide;
  a first sensor terminal conductively coupled to the doped well region on a first side of the resistor gate; and
  a second sensor terminal conductively coupled to the doped well region on a second side of the resistor gate;
 a gate driver to apply a voltage to the resistor gate that affects a resistance of the doped well region below the resistor gate; and
 a temperature analysis circuitry to:
  determine a resistance-related value corresponding with a resistance of a conductive path passing through the doped well region, wherein determining the resistance-related value comprises:
   (a) passing a predefined current along the conductive path and measuring a resistance-dependent voltage at one or both of the first sensor terminal and the second sensor terminal; or
   (b) applying a predefined voltage at the first sensor terminal and measuring a resistance-dependent current along the conductive path;
  analyze a temperature associated with the transistor array based at least on the determined resistance-related value; and
  output a temperature-related signal based on the analyzed temperature.

2. The temperature sensor of claim 1, wherein the doped well region comprises a P-well region.

3. The temperature sensor of claim 1, wherein the resistor gate is conductively coupled to a control gate for at least one transistor cell in the transistor array.

4. The temperature sensor of claim 1, wherein the second sensor terminal is conductively coupled to a transistor source terminal for at least one transistor cell in the transistor array.

5. A transistor array, comprising:
 a plurality of transistors including a plurality of transistor doped well regions formed in a substrate; and
 a temperature sensor comprising:
  a temperature sense resistor comprising:
   a sensor doped well region formed in the substrate;
   a resistor gate formed over the sensor doped well region and separated from the sensor doped well region by a gate oxide;
   a first sensor terminal conductively coupled to the sensor doped well region on a first side of the resistor gate; and
   a second sensor terminal conductively coupled to the sensor doped well region on a second side of the resistor gate;
  a gate driver to apply a voltage to the resistor gate that affects a resistance of the sensor doped well region; and
  temperature analysis circuitry to:
   determine a resistance-related value corresponding with a resistance of a conductive path passing through the sensor doped well region, wherein determining the resistance-related value comprises:
    (a) passing a predefined current along the conductive path and measuring a resistance-dependent voltage at one or both of the first sensor terminal and the second sensor terminal; or
    (b) applying a predefined voltage at the first sensor terminal and measuring a resistance-dependent current along the conductive path;
   analyze a temperature associated with the transistor array based at least on the determined resistance-related value corresponding with the resistance of the conductive path passing through the doped well region; and
   output a temperature-related signal based on the analyzed temperature.

6. The transistor array of claim 5, wherein the plurality of transistors comprises a plurality of metal-oxide-semiconductor field-effect transistors (MOSFETs).

7. The transistor array of claim 5, wherein the plurality of transistors includes a plurality of transistor gates, and wherein the resistor gate and the plurality of transistor gates are formed in a common gate layer.

8. The transistor array of claim 7, wherein the common gate layer comprises a common metal layer.

9. The transistor array of claim 5, wherein the second sensor terminal is electrically connected to a transistor source contact for at least one transistor of the plurality of transistors.

10. The transistor array of claim 9, wherein the second sensor terminal is defined by an extension of the transistor source contact.

11. The transistor array of claim 5, wherein the resistor gate is connected to a transistor gate of at least one transistor of the plurality of transistors.

12. The transistor array of claim 11, wherein the resistor gate is defined by an extension the transistor gate.

13. The transistor array of claim 5 wherein the sensor doped well region of the temperature sensor has a different dopant concentration than the transistor doped well regions of the plurality of transistors.

14. The transistor array of claim 13, wherein the sensor doped well region of the temperature sensor has a lower dopant concentration than the transistor doped well regions of the plurality of transistors.

15. A method for determining a temperature associated with transistor array using a temperature sensor integrated in the transistor array and including (a) a doped well region formed in a substrate, and (b) a resistor gate formed over the doped well region and separated from the doped well region by a gate oxide, the method comprising:
  applying a voltage to the resistor gate that affects a resistance of the doped well region;
  generating a current along a conductive path passing through the doped well region;
  determining a resistance-related value corresponding with a resistance of the conductive path passing through the doped well region, including either:
    (a) passing a predefined current along the conductive path and measuring a resistance-dependent voltage at one or both of the first sensor terminal and the second sensor terminal; or
    (b) applying a predefined voltage at the first sensor terminal and measuring a resistance-dependent current along the conductive path;
  analyzing a temperature associated with the transistor array based at least on the determined resistance-related value corresponding with the resistance of the conductive path passing through the doped well region; and
  outputting a temperature-related signal based on the analyzed temperature.

16. The method of claim 15, comprising applying the voltage to the resistor gate to increase the resistance of the doped well region.

17. The method of claim 15, comprising determining the resistance of the doped well region by a temperature analysis circuitry connected to the first sensor terminal.

18. The method of claim 15, wherein:
  the resistor gate is connected to a transistor control gate of at least one transistor of the transistor array; and
  the voltage applied to the resistor gate is defined by a control gate voltage applied to the transistor control gate.

19. The method of claim 15, wherein determining the conductive path passing through the doped well region comprises:
  supplying a current to the first sensor terminal;
  determining a voltage drop between the first sensor terminal and the second sensor terminal; and
  determining the resistance of the conductive path based on the supplied current and the measured voltage drop.

20. The method of claim 19, wherein:
  the second sensor terminal is connected to a transistor source contact for at least one transistor of the transistor array;
  a transistor source voltage is applied to the second sensor terminal; and
  determining a voltage drop between the first sensor terminal and the second sensor terminal comprises measuring a first terminal voltage at the first sensor terminal and determining a difference between the first terminal voltage and the transistor source voltage.

21. The method of claim 15, wherein determining the resistance-related value comprises:
  applying a first terminal voltage to a first sensor terminal electrically connected to the doped well region;
  measuring a current through the conductive path; and
  determining the resistance of the conductive path based on the first terminal voltage and the measured current.

* * * * *